(12) United States Patent
Ishiguro et al.

(10) Patent No.: US 11,619,604 B2
(45) Date of Patent: Apr. 4, 2023

(54) BIPOLAR ELECTRODE BUBBLE DETECTION METHOD AND APPARATUS

(71) Applicant: SANDISK TECHNOLOGIES LLC, Addison, TX (US)

(72) Inventors: Yutaka Ishiguro, Yokkaichi (JP); Shoichi Taniguchi, Yokkaichi (JP); Tomohiro Nishiwaki, Yokkaichi (JP); Ruinian Tian, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 146 days.

(21) Appl. No.: 17/320,493

(22) Filed: May 14, 2021

(65) Prior Publication Data
US 2022/0365016 A1  Nov. 17, 2022

(51) Int. Cl.
*G01N 27/07* (2006.01)
*H01L 21/027* (2006.01)

(52) U.S. Cl.
CPC .......... *G01N 27/07* (2013.01); *H01L 21/0273* (2013.01)

(58) Field of Classification Search
CPC ............ G01N 2035/1018; G01N 27/07; H01L 21/0273; H01L 22/24
USPC ....................................................... 324/693
See application file for complete search history.

(56) References Cited

U.S. PATENT DOCUMENTS

| | | | |
|---|---|---|---|
| 6,024,249 A * | 2/2000 | On ..................... | B05C 11/1007 118/52 |
| 6,355,105 B1 * | 3/2002 | Tuan ........................ | G03F 7/16 118/712 |
| 6,726,774 B2 * | 4/2004 | Tzeng ............... | H01L 21/67288 118/713 |
| 7,237,581 B2 * | 7/2007 | Jang ..................... | H01L 21/6715 141/94 |
| 7,586,564 B2 * | 9/2009 | Goto ..................... | G03F 7/0007 349/110 |
| 10,399,018 B2 * | 9/2019 | Liao ................... | H01L 21/67017 |
| 10,663,865 B2 * | 5/2020 | Lin ........................... | G03F 7/16 |
| 2004/0011285 A1 * | 1/2004 | Tzeng ............... | H01L 21/67253 118/712 |
| 2005/0212997 A1 * | 9/2005 | Goto ..................... | G03F 7/0047 349/110 |
| 2005/0224132 A1 * | 10/2005 | Jang .................... | H01L 21/6715 141/1 |
| 2008/0131775 A1 | 6/2008 | Takayama et al. | |

(Continued)

FOREIGN PATENT DOCUMENTS

CN          107918062 B  *   2/2021   ............. G01R 29/14

OTHER PUBLICATIONS

Hsueh et al., Bipolar Electrode Arrays for Chemical Imaging and Multiplexed Sensing. ACS Omega 2022, 7, 20298-20305, © 2022 The Authors. Published by American Chemical Society (Year: 2022).*

(Continued)

Primary Examiner — Jermele M Hollington
Assistant Examiner — Sean Curtis
(74) Attorney, Agent, or Firm — The Marbury Law Group PLLC

(57) ABSTRACT

A bubble detection method includes flowing a fluid through a conduit containing at least one bipolar electrode, applying an electric field across the fluid in the conduit, and detecting a presence of a bubble in the fluid when the bubble flows around or through the bipolar electrode by detecting a current or voltage output from the at least one bipolar electrode.

20 Claims, 23 Drawing Sheets

(56) References Cited

U.S. PATENT DOCUMENTS

| | | |
|---|---|---|
| 2008/0138706 A1 | 6/2008 | Takayama et al. |
| 2009/0253038 A1 | 10/2009 | Segawa et al. |
| 2013/0192130 A1 | 8/2013 | Eckelberry |
| 2015/0048035 A1* | 2/2015 | Liao ................. B01D 35/02 210/120 |
| 2020/0004157 A1* | 1/2020 | Lin ........................ G03F 7/16 |
| 2022/0365016 A1* | 11/2022 | Ishiguro ................ G01N 27/07 |

OTHER PUBLICATIONS

Fosdick et al., Bipolar Electrochemistry. Angew. Chem. Int. Ed. 2013, 52, 10438-10456. © 2013 Wiley-VCH Verlag GmbH & Co. KGaA, Weinheim (Year: 2013).*

Chow, K.F. et al., "A Large-Scale, Wireless Electrochemical Bipolar Electrode Microarray," J. Am. Chem. Soc., vol. 131, No. 24, pp. 8364-8365 (2009), DOI: 10.1021/ja902683f.

Mavé, F. et al., "Bipolar Electrodes: A Useful Tool for Concentration, Separation, and Detection of Analytes in Microelectrochemical Systems," Anal. Chem., vol. 82, No. 21, pp. 8766-8774, (2010) https://pubs.acs.org/doi/10.1021/ac101262v.

\* cited by examiner

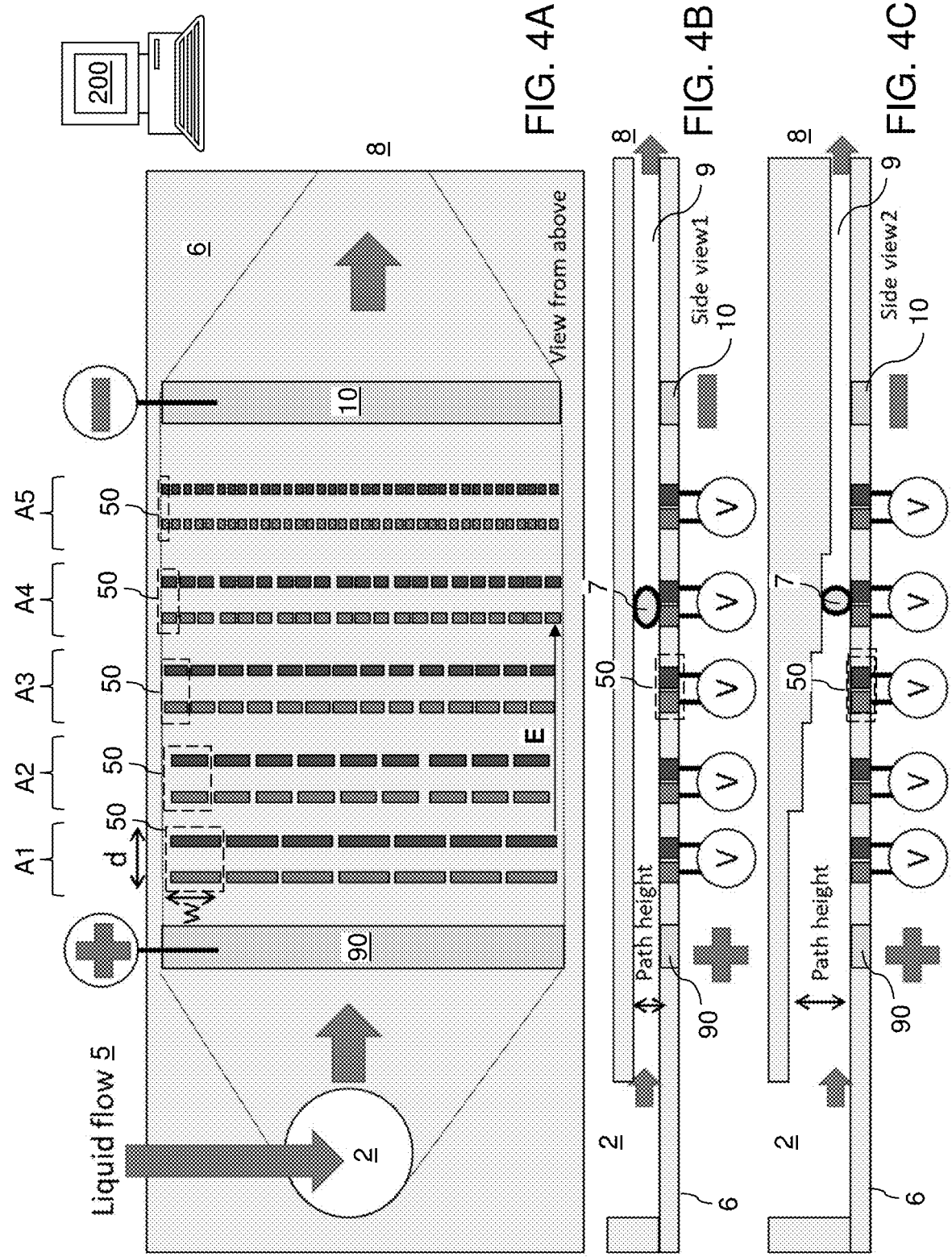

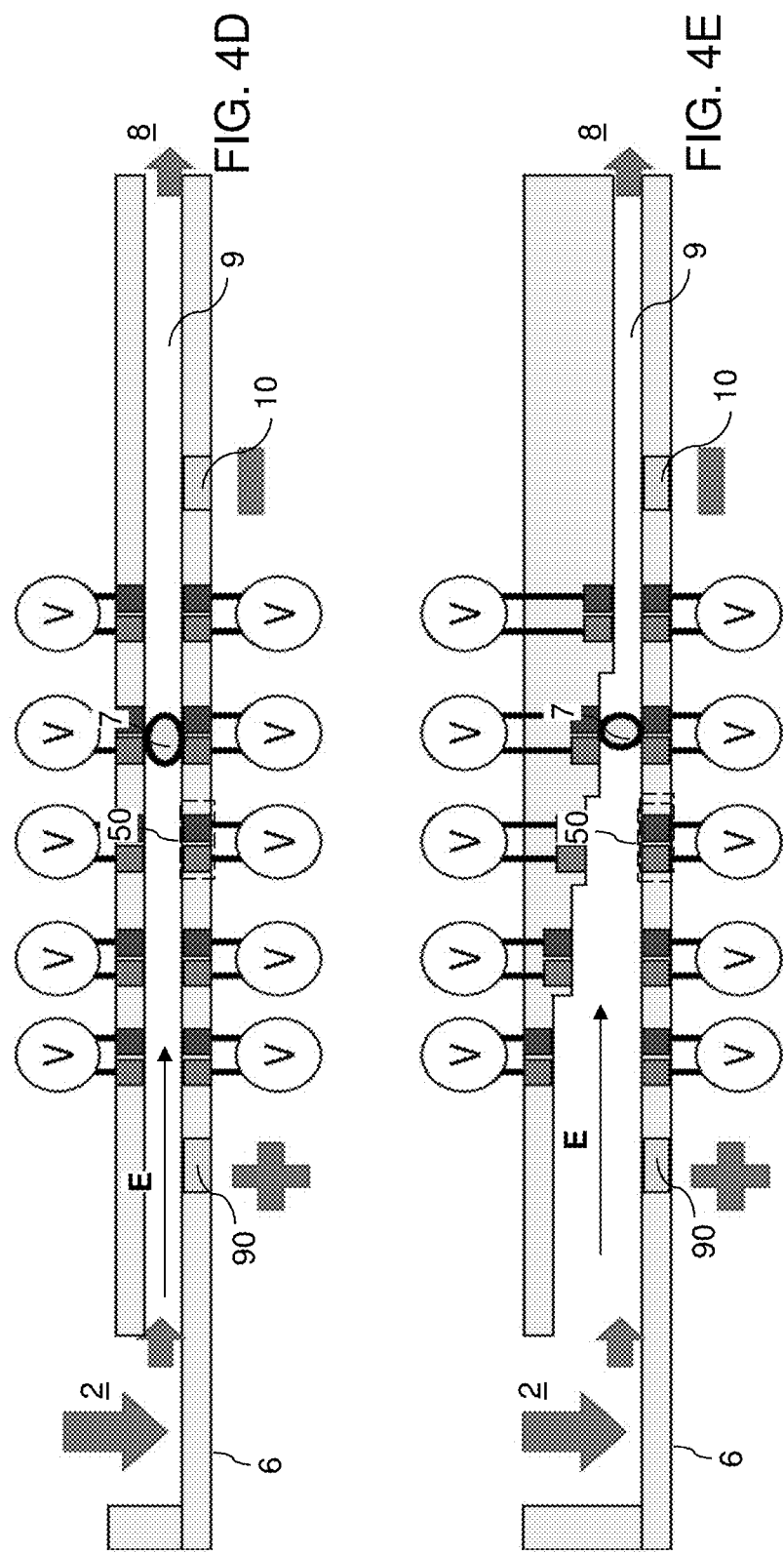

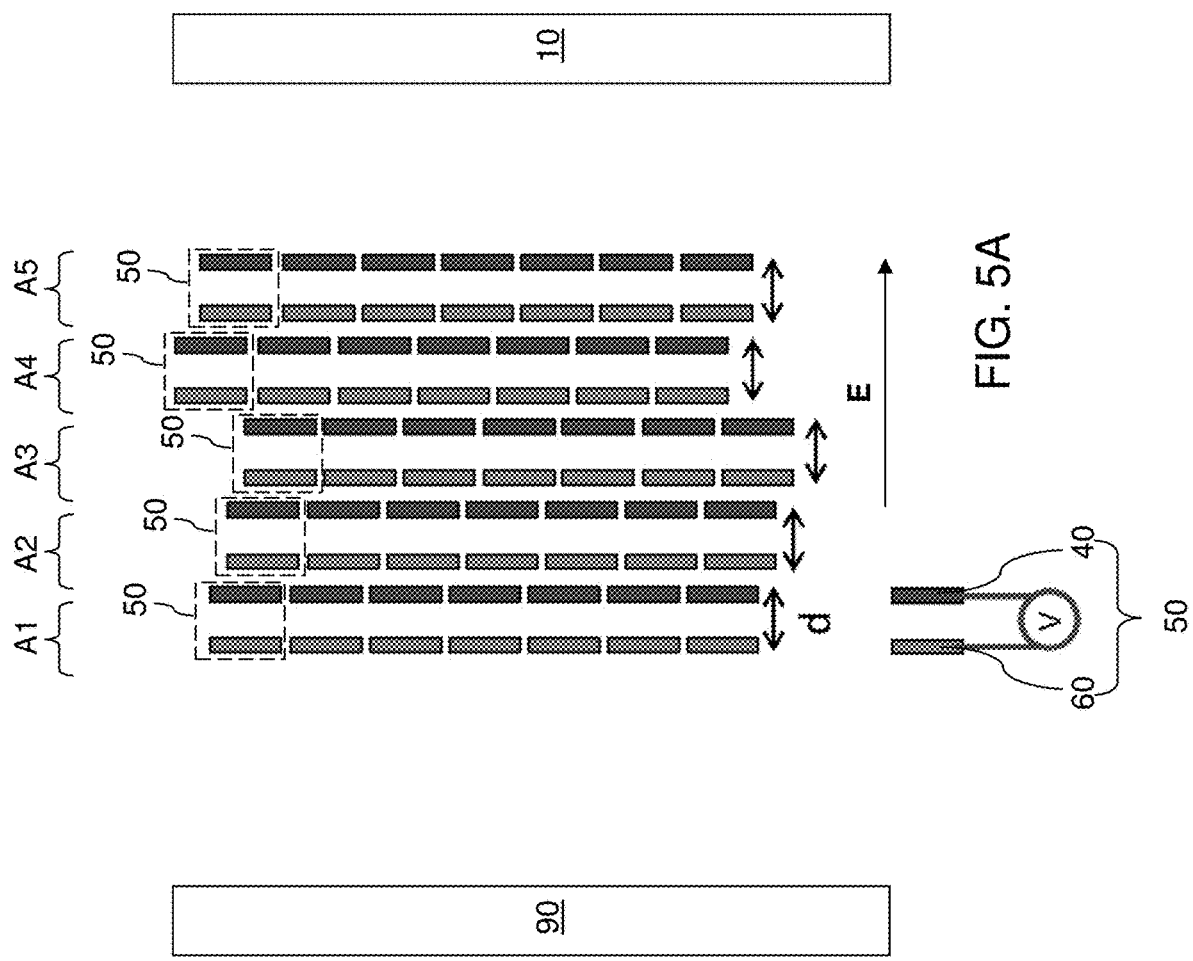

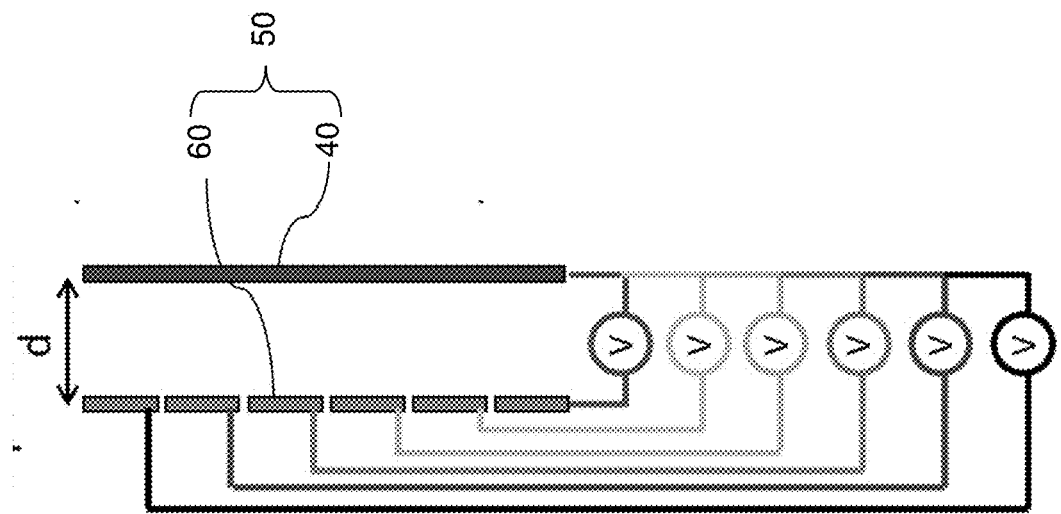
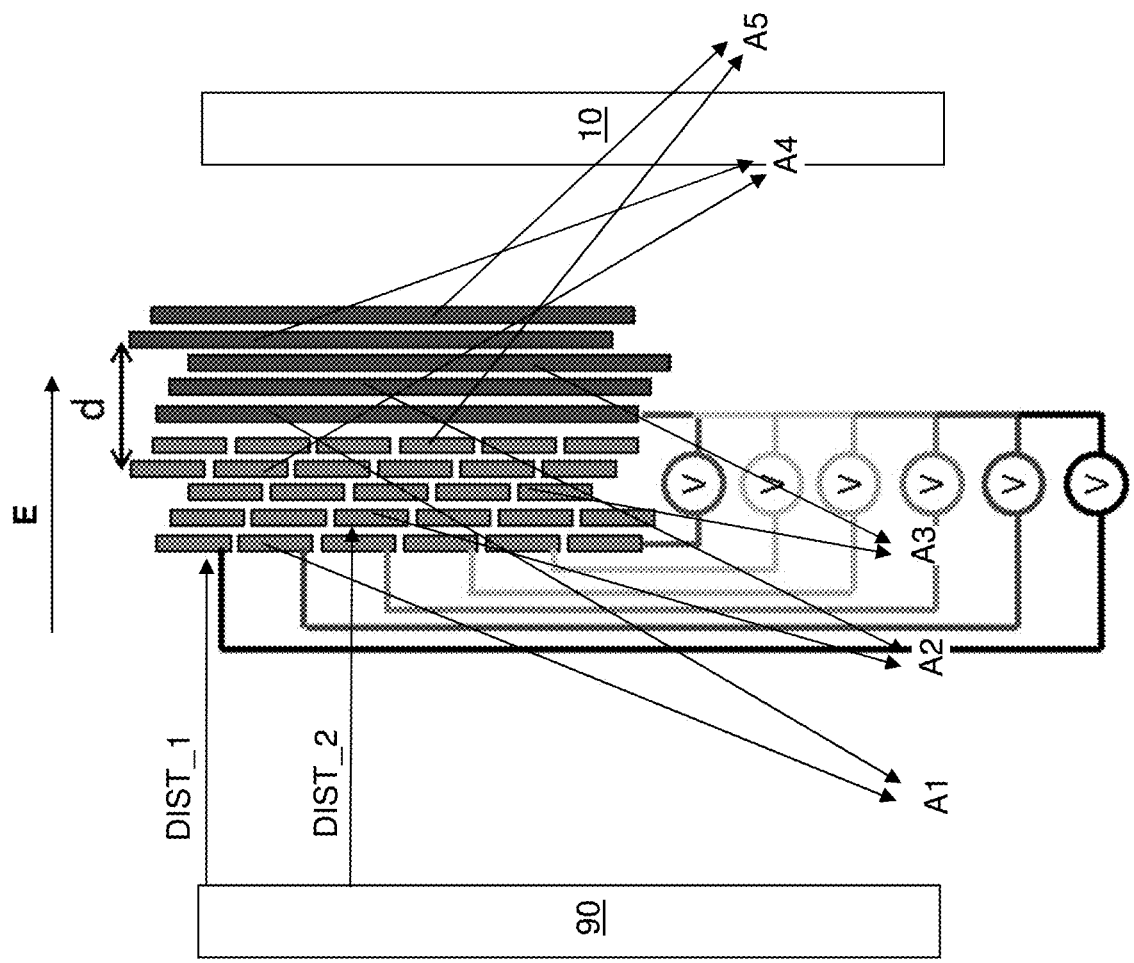

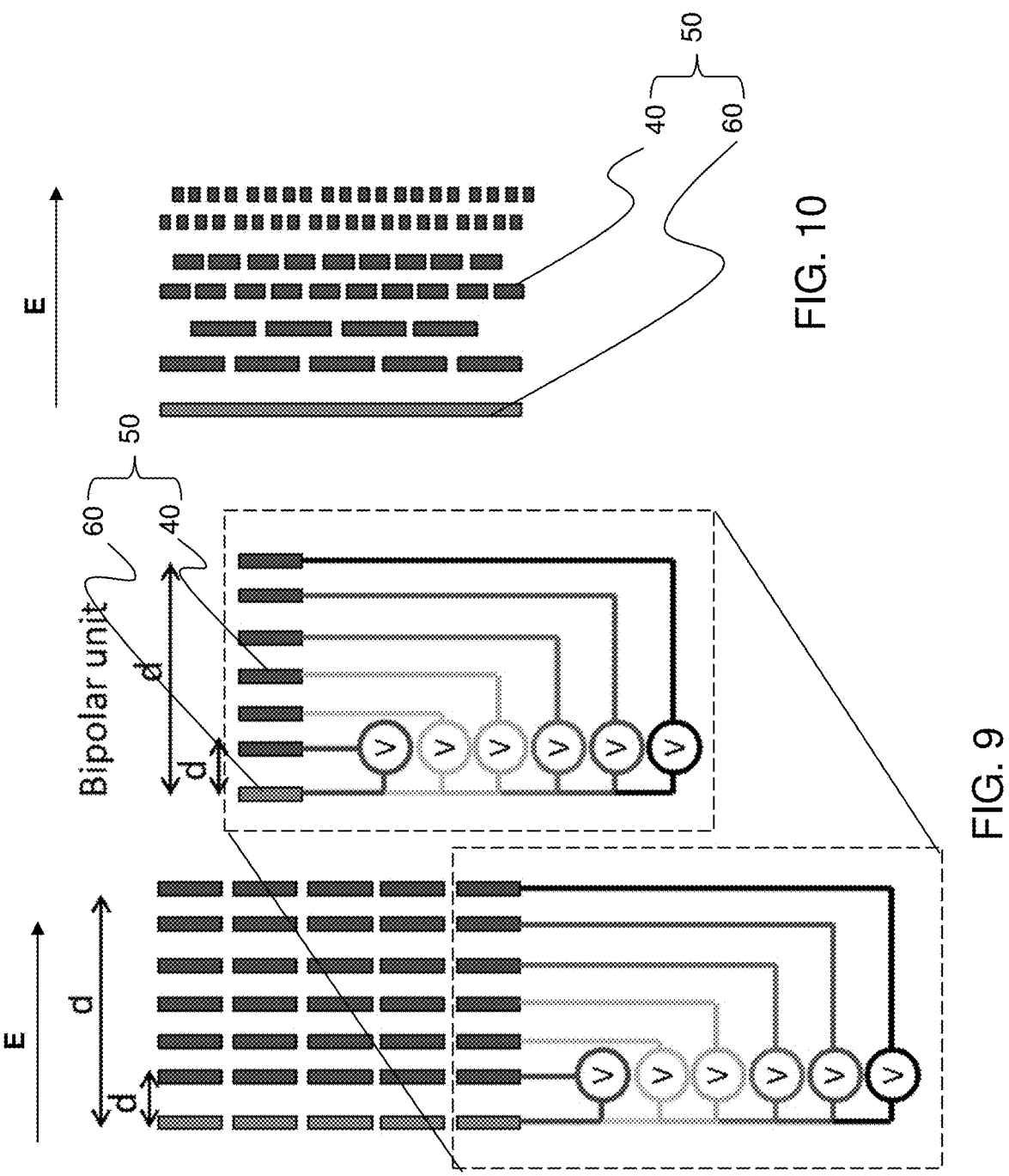

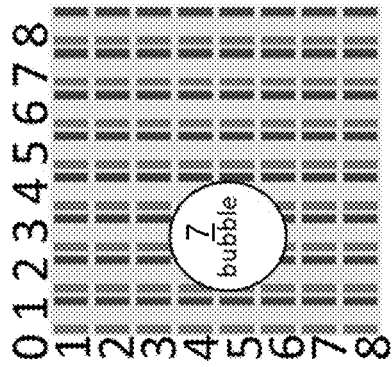
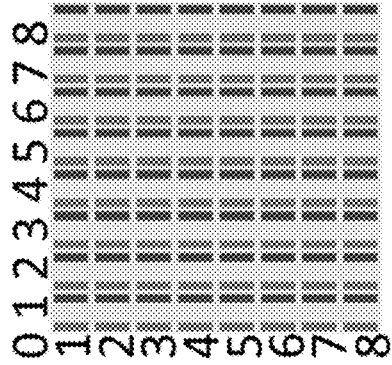
FIG. 13B
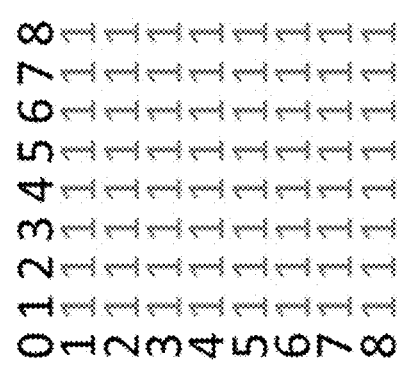
FIG. 13C

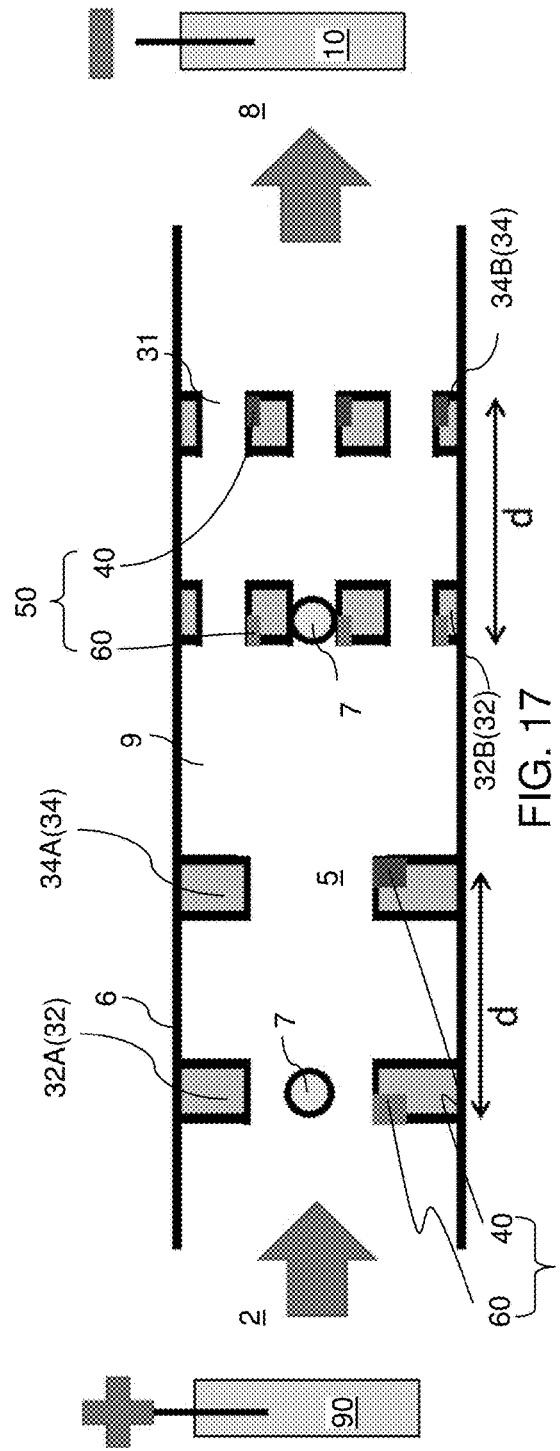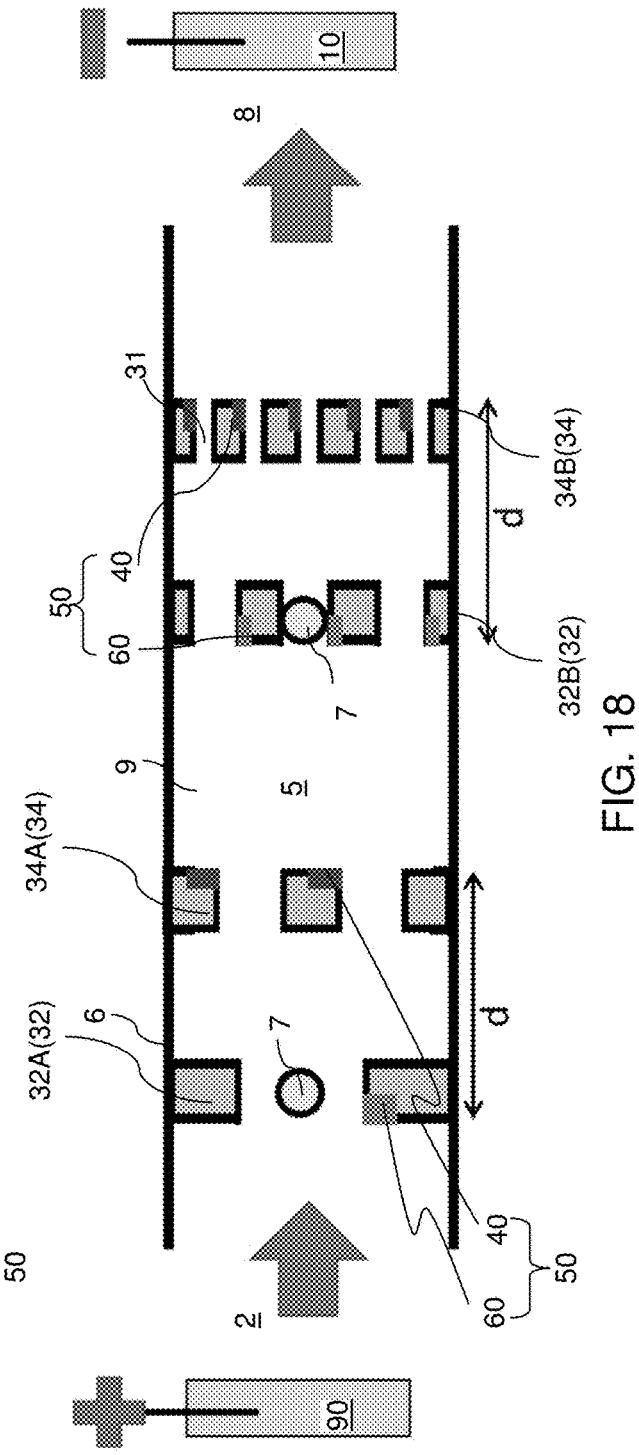

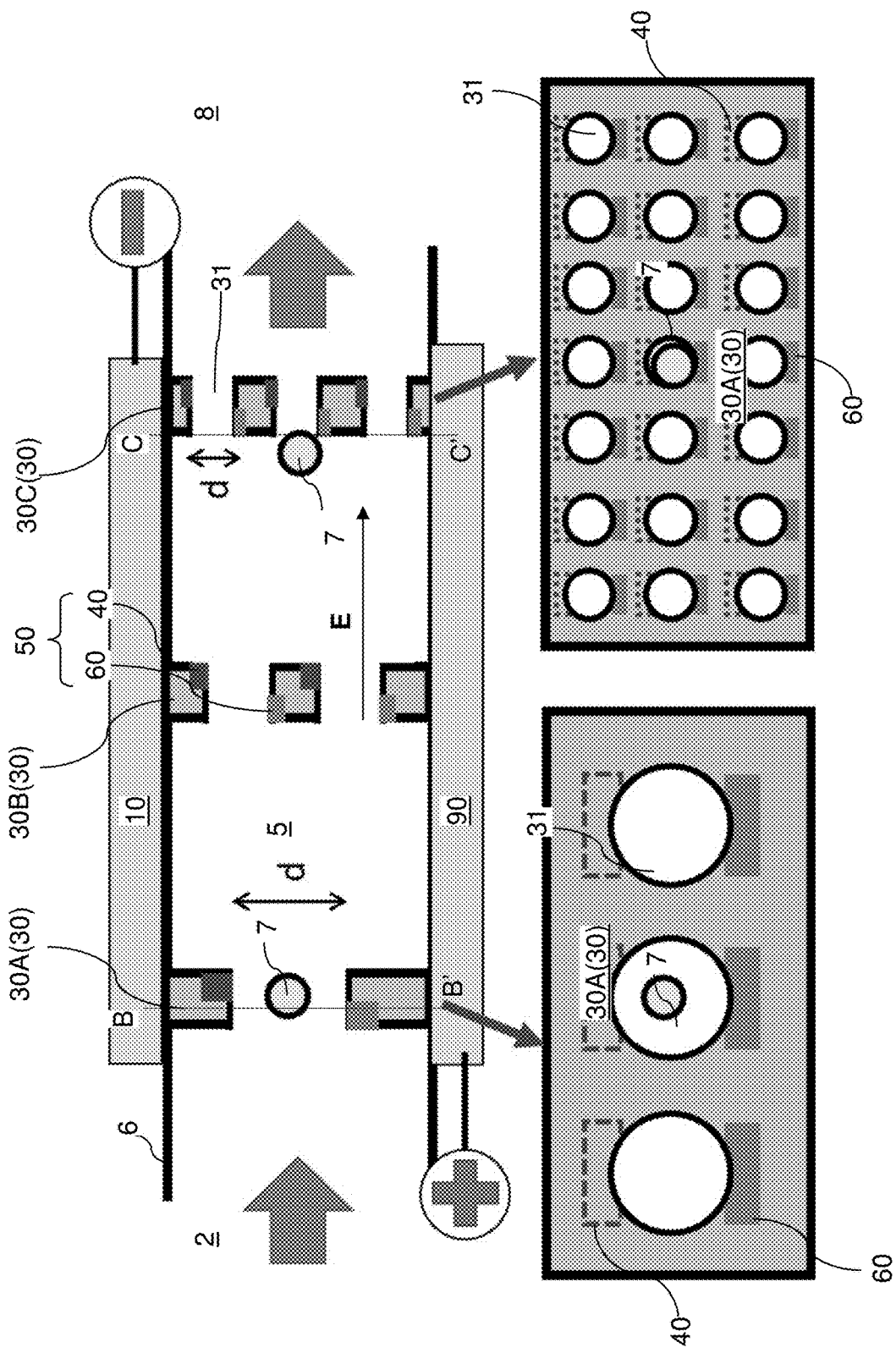

BIPOLAR ELECTRODE BUBBLE DETECTION METHOD AND APPARATUS

FIELD

The present disclosure relates generally to the field of semiconductor device manufacturing, and specifically to bipolar electrode containing apparatuses configured to detect bubbles in a fluid, such as a photoresist fluid, and methods of operating the same.

BACKGROUND

Photoresist layers are used as masks during fabrication (e.g., layer etching, etc.) of semiconductor devices. Photoresist layers are typically deposited on a semiconductor device in a solvent (e.g., as a solution or suspension) from reservoir through a pipe. However, bubbles in the photoresist solution or suspension may cause incomplete or defective photoresist mask patterns on the semiconductor devices, which may lead to defects in the semiconductor devices. The larger the bubbles size, the higher the likelihood of a major defect being created in the semiconductor device. Prior art methods for detecting bubbles in a photoresist fluid moving through a pipe typically use an optical sensor or a capacitor sensor. However, determining the size of the bubbles in the prior art sensors is difficult.

SUMMARY

According to an aspect of the present disclosure, a bubble detection apparatus comprises a container configured to flow a fluid therein, a pair of driving electrodes located on opposite sides of the container and configured to be exposed to the fluid, a bias circuit configured to apply a driving potential across the pair of driving electrodes to generate an electric field, multiple bipolar detection units located in the container and configured to be immersed in the fluid, wherein each of the multiple bipolar detection units comprises a respective first detection electrode and a respective second detection electrode that are spaced apart along a direction of the electric field within the fluid, and a current or voltage detection device configured to detect a current or voltage between the first detection electrode and the second detection electrode, and a computing unit configured to receive output currents or voltages from the current or voltage detection devices of the multiple bipolar detection units and detect presence of a bubble within the fluid when one or more of the output currents or voltages from the current or voltage detection devices of one or more of the multiple bipolar detection units drop below a respective reference level.

According to another aspect of the present disclosure, a bubble detection method includes flowing a fluid through a conduit containing at least one bipolar electrode, applying an electric field across the fluid in the conduit, and detecting a presence of a bubble in the fluid when the bubble flows around or through the bipolar electrode by detecting a current or voltage output from the at least one bipolar electrode.

BRIEF DESCRIPTION OF THE DRAWINGS

FIG. 4A is a schematic top-down view of a first configuration of the exemplary bubble detection apparatus of the present disclosure.

FIG. 4B is a schematic vertical cross-sectional view of the first configuration of the exemplary bubble detection apparatus of FIG. 4A.

FIG. 4C is a schematic vertical cross-sectional view of a first alternative embodiment of the first configuration of the bubble detection apparatus of FIG. 4A.

FIG. 4D is a schematic vertical cross-sectional view of a second alternative embodiment of the first configuration of the bubble detection apparatus of FIG. 4A.

FIG. 4E is a schematic vertical cross-sectional view of a third alternative embodiment of the first configuration of the bubble detection apparatus of FIG. 4A.

FIG. 5A is a schematic top-down view of a second configuration of the exemplary bubble detection apparatus of the present disclosure.

FIG. 8A is a schematic top-down view of a fifth configuration of the exemplary bubble detection apparatus of the present disclosure.

FIG. 8B is a view of a subset of the bipolar detection units of FIG. 8A.

FIG. 9 is a schematic top-down view of a sixth configuration of the exemplary bubble detection apparatus of the present disclosure.

FIG. 10 is a schematic top-down view of a seventh configuration of the exemplary bubble detection apparatus of the present disclosure.

FIG. 13B is a schematic top-down view of an array of bipolar detection units of the tenth configuration of the present disclosure and an accompanying data map when bubbles are absent.

FIG. 13C is a schematic top-down view of an array of bipolar detection units of the tenth configuration of the present disclosure and an accompanying data map when a bubble is present.

FIG. 17 is a schematic vertical cross-sectional view of a fourteenth configuration of the exemplary bubble detection apparatus of the present disclosure.

FIG. 18 is a schematic vertical cross-sectional view of a fifteenth configuration of the exemplary bubble detection apparatus of the present disclosure.

FIG. 19A is a schematic vertical cross-sectional view of a sixteenth configuration of the exemplary bubble detection apparatus of the present disclosure. FIGS. 19B and 19C are schematic vertical cross-sectional views along planes B-B' and C-C' in FIG. 19A of the sixteenth configuration of the exemplary bubble detection apparatus of the present disclosure.

DETAILED DESCRIPTION

A bipolar electrode (BPE) is conductor located in fluid (e.g., liquid, such as a solution or suspension). The conductor becomes an electrode having an anode and a cathode (e.g., a positive end and a negative end) by the action of an external electric field applied across the fluid from driving electrodes. In one embodiment, the presence of bubbles and/or the size of the bubbles can be detected by a change in measured voltage or current on the BPE caused by the bubbles blocking the external electric field as they pass around or through the bipolar electrode. Thus, when the driving electrodes are biased, a potential difference develops between the anode and cathode of the BPE based on the position and size of the bubble passing around or through the BPE.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. Disclosure of an embodiment in which a first element comprises a second element herein also discloses another embodiment in which the first element consists essentially of, or consists of, the second element except for cases in which presence of an additional element is inherently implied.

Figures 1A, 1B:
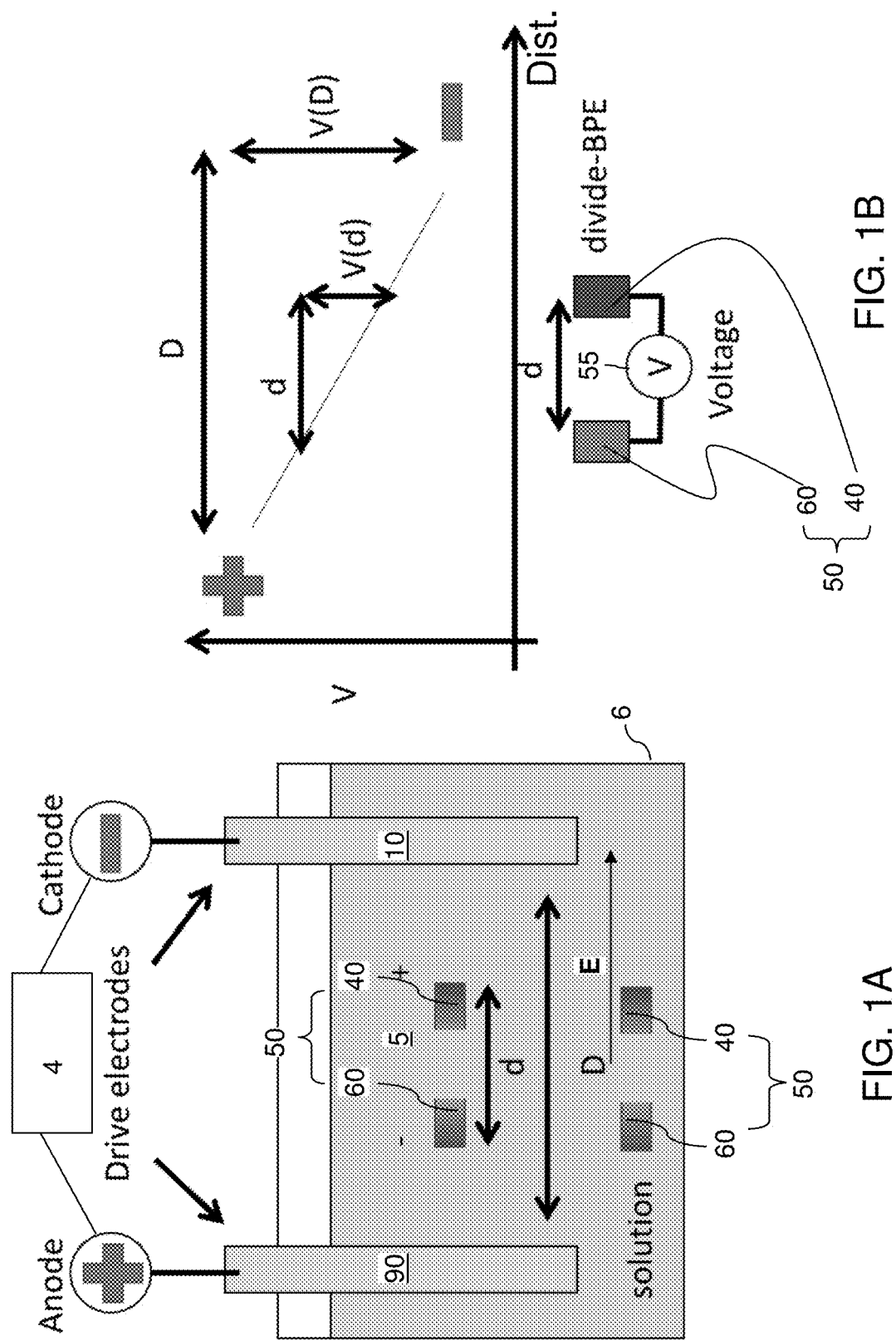
FIGS. 1A and 1B are a respective vertical cross-sectional view of an exemplary bubble detection apparatus of the present disclosure, and a schematic representation illustrating the mechanism for a voltage differential between a pair of detection electrodes of a bipolar detection unit according to an embodiment of the present disclosure.

Referring to FIGS. 1A and 1B, an exemplary bubble detection apparatus of the present disclosure is provided, which comprises a container 6 that contains a fluid 5 therein, a pair of driving electrodes (such as a driving anode 90 and a driving cathode 10) located on opposite sides of the container 6 and exposed to the fluid 5, and a bias circuit 4 configured to apply a driving potential across the pair of driving electrodes (90, 10). For example, the bias circuit 4 may be a voltage source configured to apply a positive voltage to the driving anode 90 and a negative voltage to the driving cathode 10. The bubble detection apparatus may be used to detect bubbles (e.g., small air bubbles, such as microbubbles) in any fluid. One example of the fluid is a photoresist fluid, such as a photoresist solution or suspension travelling through a pipe to be dispensed onto a semiconductor device to form a photoresist mask. The container 6 may be a conduit, such as a pipe or a manifold through which the liquid flows, such as a photoresist fluid flowing from a photoresist fluid reservoir (e.g., tank) to a nozzle positioned over a susceptor holding a substrate of a semiconductor device. A pump (not shown) may be used to pump the fluid from the reservoir to the nozzle. Other fluids, such as a spin-on glass suspension may be used instead of the photoresist fluid.

At least one bipolar detection unit 50 is immersed in the fluid 5. For example, one of multiple bipolar detection units 50 is expressly illustrated in FIGS. 1A and 1B. Each bipolar detection unit 50 comprises a respective first detection electrode 60 (which is also referred to as a detection anode) and a respective second detection electrode 40 (which is also referred to as a detection cathode) that are spaced apart along a direction of electric field E within the fluid 5 (e.g., direction from the driving anode 90 to the driving cathode 10). Further, each of the multiple bipolar detection units 50 comprises is electrically connected to a current or voltage detection device 55, such as a voltmeter (represented by a symbol including the letter "V" and a circle therearound) configured to detect a voltage across the first detection electrode 60 and the second detection electrode 40. In an alternative embodiment, the current or voltage detection device 55 may comprise an ammeter. The first and second detection electrodes (60, 40) may comprise physically separate electrically conductive electrodes which are electrically connected to opposite input terminals of the voltmeter or ammeter, or they may comprise opposing ends of a single electrically conductive electrode which are electrically connected to opposite input terminals of the voltmeter or ammeter.

A diagram in FIG. 1B illustrates the mechanism for a voltage differential between a pair of detection electrodes (60, 40) of a bipolar detection unit 50. The potential as a function of distance V(D) between the driving anode 90 (of which the location is symbolically represented by a "+" sign) and the driving cathode 10 (of which the location is symbolically represented by a "−" sign) generally decreases linearly. If the lateral spacing between the driving anode 90 and the driving cathode 10 is D and if the potential difference between the driving anode 90 and the driving cathode 10 is V(D), then the potential difference as a function of distance V(d) between a first detection electrode 60 and a second detection electrode 40 of a bipolar detection unit 50 having an electrode spacing of d and laterally spaced apart along the direction of an electric field E is given by: V(d)=V(D)×(d/D).

While FIGS. 1A and 1B illustrate an embodiment in which the first detection electrode 60 is more proximal to the driving anode 90 than the second detection electrode 40 is to the driving anode 90 within each bipolar detection unit 50, embodiments are expressly contemplated herein in which the first detection electrode 60 is more distal from the driving anode 90 than the second detection electrode 40 is from the driving anode 90 within each bipolar detection unit 50 or within a subset of multiple bipolar detection units 50. Thus, embodiments in which one of more of the multiple bipolar detection units are disposed in a flipped configuration in which positions of the first detection electrode 60 and the second detection electrode 40 are reversed in a bipolar detection unit 50 are included in the scope of the present disclosure.

Figure 2:
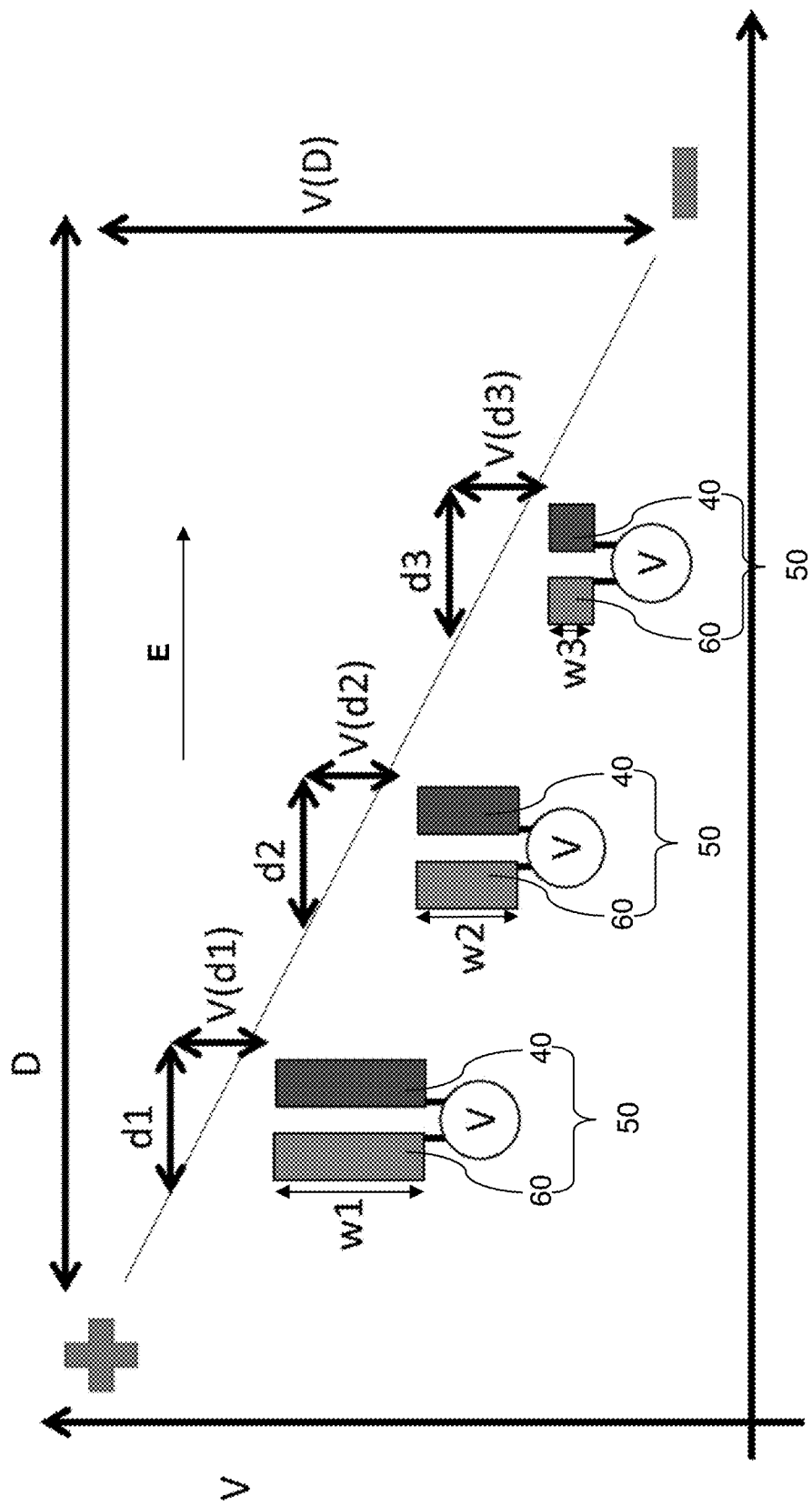
FIG. 2 is a schematic representation illustrating multiple types of bipolar detection units that can be concurrently employed within the exemplary bubble detection apparatus of the present disclosure.

Referring to FIG. 2 and according to an embodiment of the present disclosure, multiple types of bipolar detection units 50 can be concurrently employed within the exemplary bubble detection apparatus. In one embodiment, first-type bipolar detection units 50 can have a respective first detection electrode 60 and a respective second detection electrode 40 that are spaced apart along the direction of the electric field E by a first electrode spacing d1. Each of the first detection electrodes 60 and the second detection electrodes 40 in the first-type bipolar detection units 50 can have a first width w1 along a direction that is perpendicular to the direction of the electric field E. Second-type bipolar detection units 50 can have a respective first detection electrode 60 and a respective second detection electrode 40 that are spaced apart along the direction of the electric field E by a second electrode spacing d2. Each of the first detection electrodes 60 and the second detection electrodes 40 in the second-type bipolar detection units 50 can have a second width w2 along a direction that is perpendicular to the direction of the electric field E. Third-type bipolar detection units 50 can have a respective first detection electrode 60 and a respective second detection electrode 40 that are spaced apart along the direction of the electric field E by a third electrode spacing d3. Each of the first detection electrodes 60 and the second detection electrodes 40 in the third-type bipolar detection units 50 can have a third width w3 along a direction that is perpendicular to the direction of the electric field E. Additional types of bipolar detection units 50 having a respective electrode spacing between a pair of a first detection electrode 60 and a second detection electrode 40, and having a respective width for the first detection electrode 60 and the second detection electrode 40, may be provided in some embodiments.

In one embodiment, the first electrode spacing d1, the second electrode spacing d2, and the third electrode spacing d3 may be the same. The first width w1 can be greater than the second width w2, and the second width w2 can be greater than the third width w3, etc. In this case, the first potential difference V(d1) in the first-type bipolar detection units 50, the second potential difference V(d2) in the second-type bipolar detection units 50, and the third potential difference V(d3) in the third-type bipolar detection units can be the same irrespective of the differences between the first width w1, the second width w2, and the third width w3. In other words, different types of bipolar detection units 50 measures a same potential difference irrespective of the widths if the electrode spacing between the first detection electrode 60 and the second detection electrode 40 is the same in the direction of the electric field, and if the different types of bipolar detection units 50 are oriented in the same direction within the fluid 5.

Generally, the lateral dimension (such as a width along a direction perpendicular to the electric field E) of each bipolar detection unit 50 may be in the range of the diameter of spherical bubbles to be detected. For example, the lateral dimension (such as a width along a direction perpendicular to the electric field E) of each bipolar detection unit 50 may be in a range from 1 microns to 10 mm, such as from 10 microns to 1 mm, although lesser and greater dimensions may also be employed.

Figure 3:
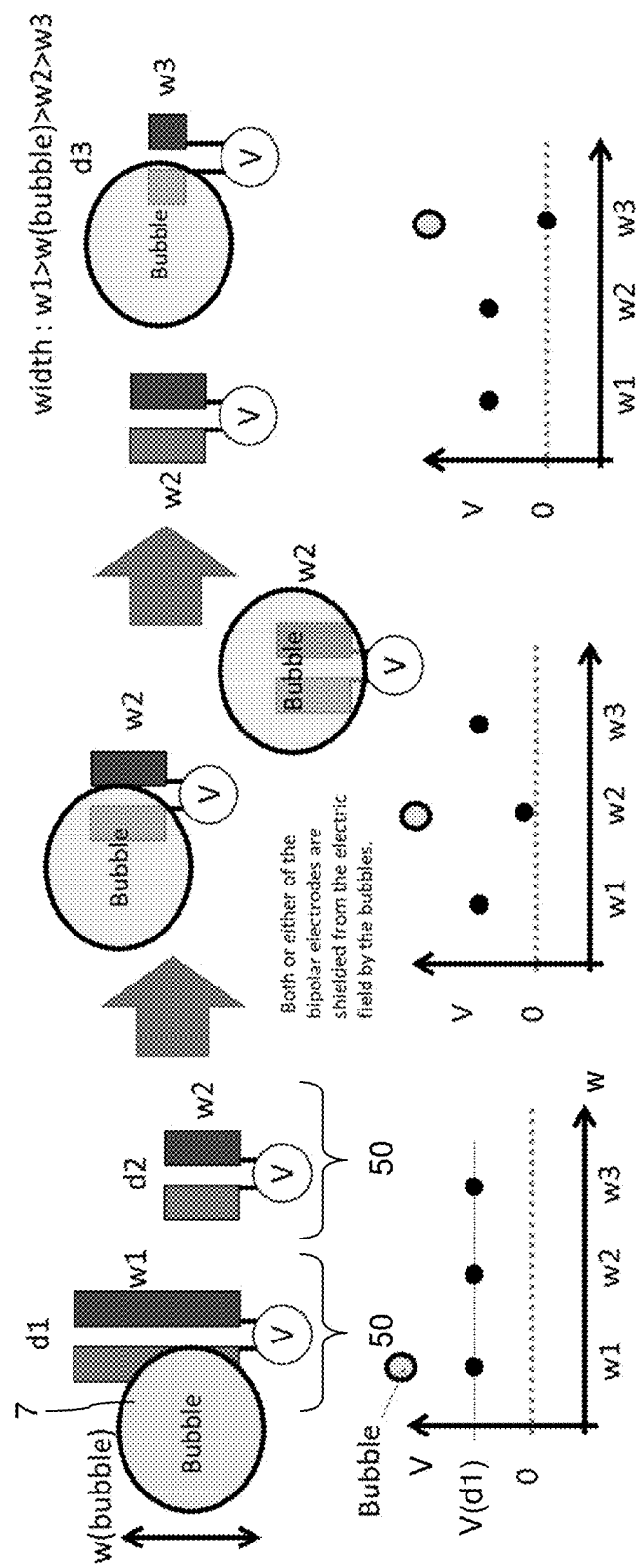
FIG. 3 is a schematic representation illustrating a bubble detection mechanism for the multiple types of bipolar detection units illustrated in FIG. 2.

Referring to FIG. 3 and according to an embodiment of the present disclosure, the multiple types of bipolar detection units 50 can be advantageously employed to detect presence and the size (e.g., diameter) of a bubble 7 within the fluid 5. Generally, bubbles 7 can float along within the fluid 5 in the general direction of flow of the fluid 5 within the container 6. The bubbles generate a locally inhomogeneous environment within the fluid 5, and generate defects in the dispensed fluid (e.g., in the dispensed photoresist). Thus, detection of the presence and/or the density of bubbles 7 in the fluid 5 can indicate whether the dispensed fluid (e.g., photoresist) is suitable for use (e.g., as a mask on a semiconductor device) or if it should be discarded and a different volume of photoresist used as a mask on the semiconductor device. Further, the bubble detection apparatus of the embodiments present disclosure allows measurement of lateral dimensions (such as the diameter) of the bubbles as will be described below. Thus, the apparatus can determine if the bubble size is sufficiently large to cause unacceptable defects in the dispensed fluid (e.g., in the photoresist mask), in which the fluid is discarded, or are sufficiently small as not to cause unacceptable defects in the dispensed fluid, in which case the fluid is used for its intended purpose (e.g., the dispensed photoresist can be used as a mask or the dispensed spin-on glass can be used as a dielectric layer in the semiconductor device).

In an embodiment in which a spherical bubble (e.g., air bubble) 7 has a diameter that is less than the first width w1 and is greater than the second width w2 and the third width w3, the spherical bubble cannot completely electrically isolate from the fluid 5 the first detection electrode 60 and the second detection electrode 40 of the first-type bipolar detection unit 50 because at least a portion of the first detection electrode 60 and at least a portion of the second detection electrode 40 are in contact with the fluid 5 all the time, i.e., even when a bubble passes through or around (i.e., envelops) the first-type bipolar detection unit 50. As discussed with reference to FIG. 2, the potential difference between the first detection electrode 60 and the second detection electrode 40 is V(d1) irrespective of the lateral dimensions of portions of the first detection electrode 60 and the second detection electrode 40 that are in contact with the fluid 5.

However, when the bubble passes through or around the second-type bipolar detection unit 50 or the third-type bipolar detection unit 50, at least one of the first detection electrode 60 and the second detection electrode 40 of the second-type bipolar detection unit 50 or the third-type bipolar detection unit 50 can be completely enveloped within the bubble 7 and thus electrically isolated from the fluid 5. In other words, direct contact between a first detection electrode 60 and the fluid 5, or direct contact between a second detection electrode 40 and the fluid 5, can be lost during transit of the bubble 7 through or around the second-type bipolar detection unit 50 or the third-type bipolar detection unit 50. When the direct contact between the fluid 5 and either of the first detection electrodes 60 and the second detection electrodes 40 is lost, the bubble 7 shields the electrodes from the electric field. In this case, the voltage between a pair of a first detection electrode 60 and a second detection electrode 40 can be decreased from V(d1) to a lower value, such as zero volts, and the second-type bipolar detection unit 50 or the third-type bipolar detection unit 50 measures presence of a bubble that is at least as big as the width (i.e., w2 or w3) of a respective bipolar detection unit 50.

The three graphs in the lower portion of FIG. 3 illustrate changes in the electrical potential (i.e., measured voltage) for three bipolar detection units 50 when the same bubble 7 sequentially passes through or around a first-type bipolar detection unit 50, a second-type bipolar detection unit 50, and a third-type bipolar detection unit 50. Therefore, the existence and the approximate size of bubbles can be determined by monitoring changes in the output (e.g., output voltage) of the multiple types of bipolar detection units 50 of the present disclosure. If the measured voltage from a unit 50 drops below the reference voltage (e.g., V(d1)), then a bubble 7 having a diameter that is at least equal to the width of the electrode(s) (40 and/or 60) is detected.

According to an embodiment of the present disclosure, the multiple types of bipolar detection units 50 comprise first-type bipolar detection units 50 having a respective first-type first detection electrode 60 and a respective first-type second detection electrode 40, and second-type bipolar detection units 50 having a respective second-type first detection electrode 60 and a respective second-type second detection electrode 40, and optionally additional types of bipolar detection units 50. Each of the second-type first detection electrodes 60 differs from each of the first-type first detection electrodes 60 by at least one dimension, such as a width along a direction that is perpendicular to the direction of the electric field E. If present, the detection electrodes (60, 40) of the additional types of bipolar detection units 50 can differ from the detection electrodes (60, 40) of the first-type bipolar detection units 50 and the second second-type bipolar detection units 50 by at least one dimension, such as a width along a direction that is perpendicular to the direction of the electric field E.

In one embodiment, each of the first-type first detection electrodes 60 has a first lateral dimension (such as a first width w1) along a direction that is perpendicular to the direction of the electric field E, and each of the second-type first detection electrodes 60 has a second lateral dimension (such as a second width w2) along the direction that is perpendicular to the direction of electrical filed E. The second lateral dimension is different from the first lateral dimension.

In one embodiment, a first electrode spacing d1 between the respective first-type first detection electrode 60 and the respective first-type second detection electrode 40 in a first-type bipolar detection unit 50 is the same as a second electrode spacing d2 between the respective second-type first detection electrode 60 and the respective second-type second detection electrode 40. If present, the detection electrodes (60, 40) of the additional types of bipolar detection units 50 can have the same electrode spacing between a respective pair of a first detection electrode 60 and a second detection electrode 40 as the first electrode spacing d1 and the second electrode spacing d2.

Referring to FIGS. 4A and 4B, a first configuration of the exemplary bubble detection apparatus of the present disclosure is illustrated. The bubble detection apparatus includes a container 6 that contains a fluid 5 therein, a pair of driving electrodes (such as a driving anode 90 and a driving cathode 10) located on opposite sides of the container 6 and exposed to the fluid 5, a bias circuit (not expressly shown for clarity, the same as the bias circuit 4 in FIG. 1) configured to apply a driving potential across the pair of driving electrodes (90, 10), and multiple bipolar detection units 50 immersed in the fluid 5. Each of the multiple bipolar detection units 50 comprises a respective first detection electrode 60 and a respective second detection electrode 40 that are spaced apart along a direction of the electric field E within the fluid 5 and comprises a voltmeter configured to detect a voltage across the first detection electrode 60 and the second detection electrode 40. According to an aspect of the present disclosure, the first configuration of the exemplary bubble detection apparatus comprises a computing unit 200 (such as a special or general processor, for example a computer loaded with a specialized program for processing data from the multiple bipolar detection units 50) configured to receive output voltages (wirelessly or via a wire) from the voltmeters 55 of the multiple bipolar detection units 50 and detect presence of a bubble 7 within the fluid 5 when one or more of the output voltages from the voltmeters 55 of the multiple bipolar detection units 50 drop below a respective reference level (e.g., V(d1)), e.g., to zero volts.

In one embodiment, the multiple bipolar detection units 50 may be arranged along the direction of the liquid 5 flow path (i.e., channel) 9 in the container 6 (e.g., pipe or manifold). In one embodiment, the liquid flow path 9 may be parallel to the direction of the electric field E. The bipolar detection units 50 can be placed between the driving electrodes (90, 10). The fluid 5 may be continuously supplied from an inlet 2 of the container 6, and may be continuously dispensed out at an outlet 8 of the container 6, which may be connected to a drainage mechanism (such as a nozzle, mechanical pump and/or a conduit that causes a gravity-induced flow).

As discussed above, the multiple types of bipolar detection units 50 comprise first-type bipolar detection units 50 having a respective first-type first detection electrode 60 and a respective first-type second detection electrode 40, and second-type bipolar detection units 50 having a respective second-type first detection electrode 60 and a respective second-type second detection electrode 40, and optionally additional types of bipolar detection units 50. Each of the second-type first detection electrodes 60 differs from each of the first-type first detection electrodes 60 by at least one dimension, such as a width along a direction that is perpendicular to the direction of the electric field E. If present, the detection electrodes (60, 40) of the additional types of bipolar detection units 50 can differ from the detection electrodes (60, 40) of the first-type bipolar detection units 50 and the second second-type bipolar detection units 50 by at least one dimension, such as a width along a direction that is perpendicular to the direction of the electric field E.

In one embodiment, the dimension that varies among the multiple types of bipolar detection units 50 may change in stages. In one embodiment, different types of bipolar detection units 50 may be arranged as respective arrays (A1, A2, A3, A4, A5) of bipolar detection units 50 that are located at different distances from one of the driving electrodes (90, 10) (such as the driving anode 90). For example, a first array A1 of first-type bipolar detection units can be located at a first distance from the driving electrode 90, a second array A2 of second-type bipolar detection units can be located at a second distance greater than the first distance from the driving electrode 90, a third array A3 of third-type bipolar detection units can be located at a third distance greater than the second distance from the driving electrode 90, a fourth array A4 of fourth-type bipolar detection units can be located at a fourth distance greater than the third distance from the driving electrode 90, and a fifth array A5 of fifth-type bipolar detection units can be located at a fifth distance greater than the fourth distance from the driving electrode 90. In one embodiment, the width of each type of bipolar detection units 50 may have a respective width that is different from the width of a bipolar detection unit 50 of any other type.

In one embodiment, the first-type bipolar detection units 50 may be arranged as a first array A1 of first-type bipolar detection units 50 located on a first plane that is perpendicular to the direction of the electric field E and laterally spaced from the driving anode 90 by a first distance, and the second-type bipolar detection units 50 may be arranged as a second array A2 of second-type bipolar detection units 50 located on a second plane that is perpendicular to the direction of the electric field E and laterally spaced from the first plane.

In one embodiment, the container 6 comprises a tubular enclosure (e.g., pipe or manifold) configured to confine the fluid 5 along directions that are perpendicular to the direction of the electric field E. In one embodiment shown in FIG. 4B, the area laterally surrounded by inner sidewalls of the tubular enclosure within a plane that is perpendicular to the direction of the electric field E may be invariant with a lateral distance from one of the pair of driving electrodes (90, 10) (such as the driving anode 90) along the direction of the electric field E. In other words, the container 6 may comprise a pipe having a uniform inner diameter along its axis. In another embodiment shown in FIG. 4C, the area laterally surrounded by inner sidewalls of the tubular enclosure within a plane that is perpendicular to the direction of the electric field E may vary with a lateral distance from one of the pair of driving electrodes (90, 10) (such as the driving anode 90) along the direction of the electric field E. In other words, the container 6 may comprise a pipe having a non-uniform inner diameter which increases or decreases continuously or in a stepwise manner along the axis of the pipe.

While the container 6 may comprise a cylindrical pipe in the embodiment described above, in alternative embodiments, the container 6 may comprise a tubular enclosure (e.g., pipe or manifold) having a vertical cross-sectional shape other than a circle, such as a rectangle, a rounded rectangle, an ellipse, or any generally curvilinear two-dimensional shape having a closed periphery within vertical planes that are perpendicular to the direction of the electric field E. In one embodiment, the vertical dimension (i.e., height) of the path of the fluid 5 may be the same or smaller than the width of bipolar detection units 50 of the narrowest-type in order to increase the probability of contact between the bipolar detection units 50 and the bubbles 7, i.e., in order to increase the probability of detection of the smallest bubbles 7.

In one embodiment, the multiple bipolar detection units 50 comprise a first array A1 of bipolar detection units 50 including a first subset of the multiple bipolar detection units 50 arranged within a first plane that is perpendicular to the direction of the electric field E and located at a first distance from one of the pair of driving electrodes (90, 10) (such as the driving anode 90), and a second array A2 of bipolar detection units 50 including a second subset of the multiple bipolar detection units 50 arranged within a second plane that is perpendicular to the direction of the electric field E and located at a second distance from the one of the pair of driving electrodes. The second distance is different from the first distance.

Generally, a plurality of arrays (A1, A2, A3, A4, A5) of bipolar detection units 50 including a respective type of bipolar detection units 50 can be provided. Each type of bipolar detection units 50 may have different dimensions along a direction that is perpendicular to the direction of the electric field E, such as a width along the direction that is perpendicular to the direction of the electric field E. Each array (A1, A2, A3, A4, A5) of bipolar detection units can be laterally spaced from the driving anode 90 by different distances.

In one embodiment, the bubble detection apparatus of the embodiments present disclosure may comprise an inlet 2 configured to receive a flow of the fluid 5 into the container 6, and an outlet 8 configured to dispense the fluid 5 from the container 6 therethrough. The inlet 2 and the outlet 8 may be spaced apart along a separation direction between the pair of driving electrodes (90, 10).

Referring to FIG. 4C, a first alternative embodiment of the first configuration of the bubble detection apparatus of FIGS. 4A and 4B is illustrated. In this case, the diameter or height of the channel 9 (i.e., the area laterally surrounded by inner sidewalls of the tubular enclosure of the container 6 within a plane that is perpendicular to the direction of the electric field E) can change as a function of the lateral distance from one of the pair of driving electrodes (90, 10) (such as the driving anode 90) along the direction of the electric field E. For example, the height of the conductive path for the fluid 5 may change continuously or stepwise as a function of the lateral distance from one of the pair of driving electrodes (90, 10) (such as the driving anode 90) along the direction of the electric field E. In one embodiment, the height of the conductive path for the fluid 5 may be greater over an array of bipolar detection units 50 having a greater width than over another array of bipolar detection units 50 having a lesser width.

Referring to FIG. 4D, a second alternative embodiment of the first configuration of the bubble detection apparatus can be derived from the first configuration of the bubble detection apparatus of FIGS. 4A and 4B by providing arrays of bipolar detection units 50 on a pair of surfaces of the tubular enclosure that face each other, such as a top surface and a bottom surface. The probability of detection of bubbles 7 increases through use of a pair of arrays of bipolar detection units 50 on a pair of opposing surfaces instead of a single array of bipolar detection units 50 located on a single surface.

Referring to FIG. 4E, a third alternative embodiment of the first configuration of the bubble detection apparatus can be derived from the first alternative embodiment of the first configuration of the bubble detection apparatus of FIG. 4C by providing arrays of bipolar detection units 50 on a pair of surfaces of the tubular enclosure that face each other, such as a top surface and a bottom surface. The probability of detection of bubbles 7 increases through use of a pair of arrays of bipolar detection units 50 on a pair of opposing surfaces instead of a single array of bipolar detection units 50 located on a single surface.

Figure 5B:
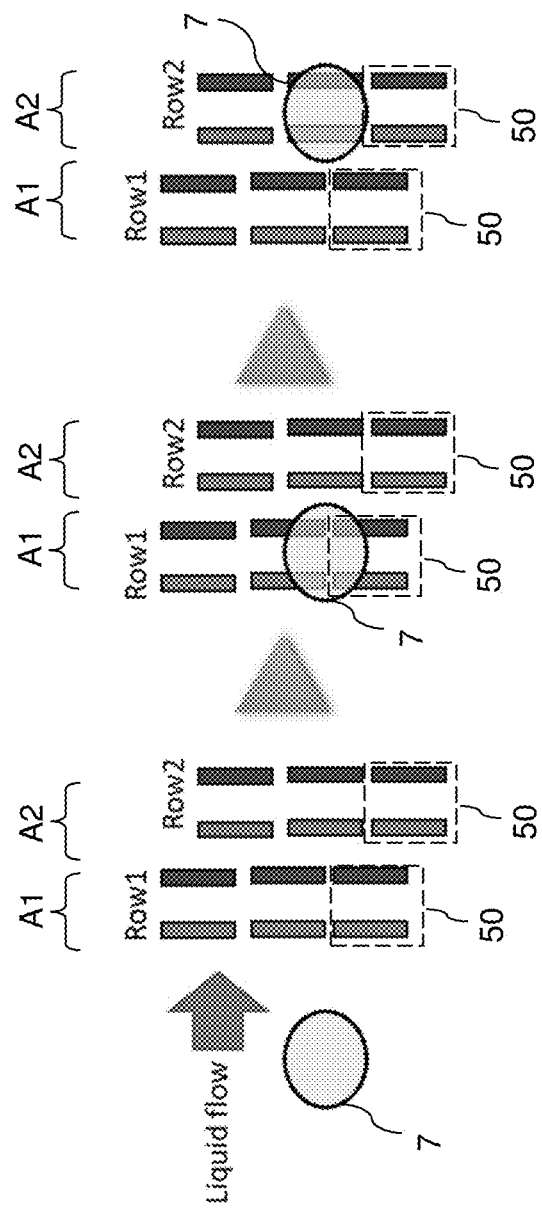
FIG. 5B is a schematic representation illustrating a bubble detection mechanism for the bipolar detection units illustrated in FIG. 5A.

Referring to FIGS. 5A and 5B, a second configuration of the exemplary bubble detection apparatus can be derived from the first configuration of the exemplary bubble detection apparatus by providing lateral offsets in a direction perpendicular to the electric field direction among the multiple arrays of bipolar detection units 50, and by employing a same width for each bipolar detection unit 50 within the multiple arrays of bipolar detection units 50. In one embodiment, a first array A1 of bipolar detection units 50 can be located at a first distance from the driving anode 90, and a second array A2 of bipolar detection units 50 can be located at a second distance from the driving anode 90. The first array of bipolar detection units 50 and the second array of bipolar detection units 50 can be periodic one-dimensional arrays having a uniform pitch along a lateral direction that is parallel to the first plane and the second plane. In one embodiment, the second array A2 of bipolar detection units 50 can be laterally offset from the first array A1 of bipolar detection units 50 along the lateral direction by a lateral offset distance that is in a range from 10% to 90% of the uniform pitch.

In configurations in which the lateral offset among the arrays (A1, A2, A3, A4, A5) of bipolar detection units 50 is zero, a significant fraction of spherical bubbles 7 having a diameter that is less than the maximum lateral extent of a neighboring pair of bipolar detection units 50 along the direction perpendicular to the flow of the fluid 5 may pass through the arrays (A1, A2, A3, A4, A5) of bipolar detection units 50 without detection by passing through the gap between the neighboring pair of bipolar detection units 50.

Referring to FIG. 5B, staggering of the arrays (A1, A2, A3, A4, A5) of bipolar detection units 50 along the direction that is perpendicular to the flow of the fluid 5 and perpendicular to the electric field direction with lateral offsets can increase the probability of detection of the bubbles 7. For example, the bubble 7 is not detected in array A1, but is detected in array A2 which is laterally offset from array A1. The lateral offset distance between a pair of arrays (A1, A2, A3, A4, A5) may be in a range from 10% to 90% of the uniform pitch. Thus, the efficiency of bubble detection can be increases by laterally staggering the multiple arrays (A1, A2, A3, A4, A5) of bipolar detection units 50.

Figure 6:
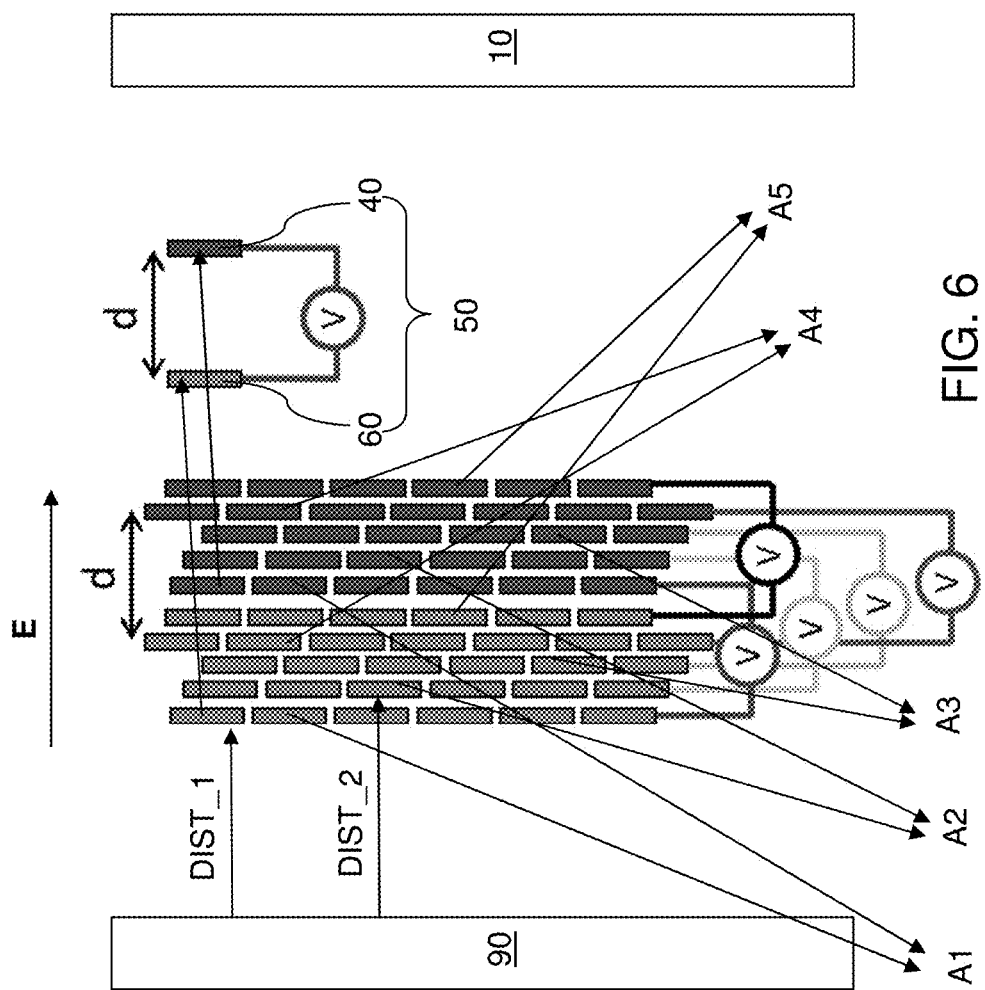
FIG. 6 is a schematic top-down view of a third configuration of the exemplary bubble detection apparatus of the present disclosure.

Referring to FIG. 6, a third configuration of the exemplary bubble detection apparatus of the present disclosure may be derived from the first configuration or the second configuration by interlacing the detection electrodes (60, 40) of different arrays (A1, A2, A3, A4, A5) of bipolar detection units 50. In this case, the electrode spacing between a first detection electrode 60 and a second detection electrode 40 within each bipolar detection unit 50 may be about the same as in the first and second configurations, or may be greater than the electrode spacing in the first and second configurations.

In one embodiment, the first array A1 of bipolar detection units 50 including a first subset of the multiple bipolar detection units 50 can be arranged within a first plane that is perpendicular to the direction of electric field E and is located at a first distance DIST_1 from one of the pair of driving electrodes (90, 10), and a second array A2 of bipolar detection units 50 including a second subset of the multiple bipolar detection units 50 can be arranged within a second plane that is perpendicular to the direction of electric field E and is located at a second distance DIST_2 from the one of the pair of driving electrodes. The second distance DIST_2 can be different from the first distance DIST_1. For example, a first array A1 of bipolar detection units 50 may be located in a first plane located at a first distance DIST_1 from the driving anode 90, and a second array A2 of bipolar detection units 50 may be located in a second plane located at a second distance DIST_2 from the driving anode 90.

In one embodiment, an electrode spacing within the first subset of the multiple bipolar detection units 50, and/or within each of the multiple bipolar detection units 50, can be greater than the distance between the first plane and the second plane, i.e., the difference between the second distance DIST_2 and the first distance DIST_1. In this case, second detection electrodes 40 within the first subset (such as the first array A1) of the multiple bipolar detection units 50 are more distal from the one of the pair of driving electrodes (90, 10) (such as the driving anode 90) than first detection electrodes 60 within the second subset (such as the second array A2) of the multiple bipolar detection units 50 are from the one of the pair of driving electrodes (90, 10).

Figure 7:
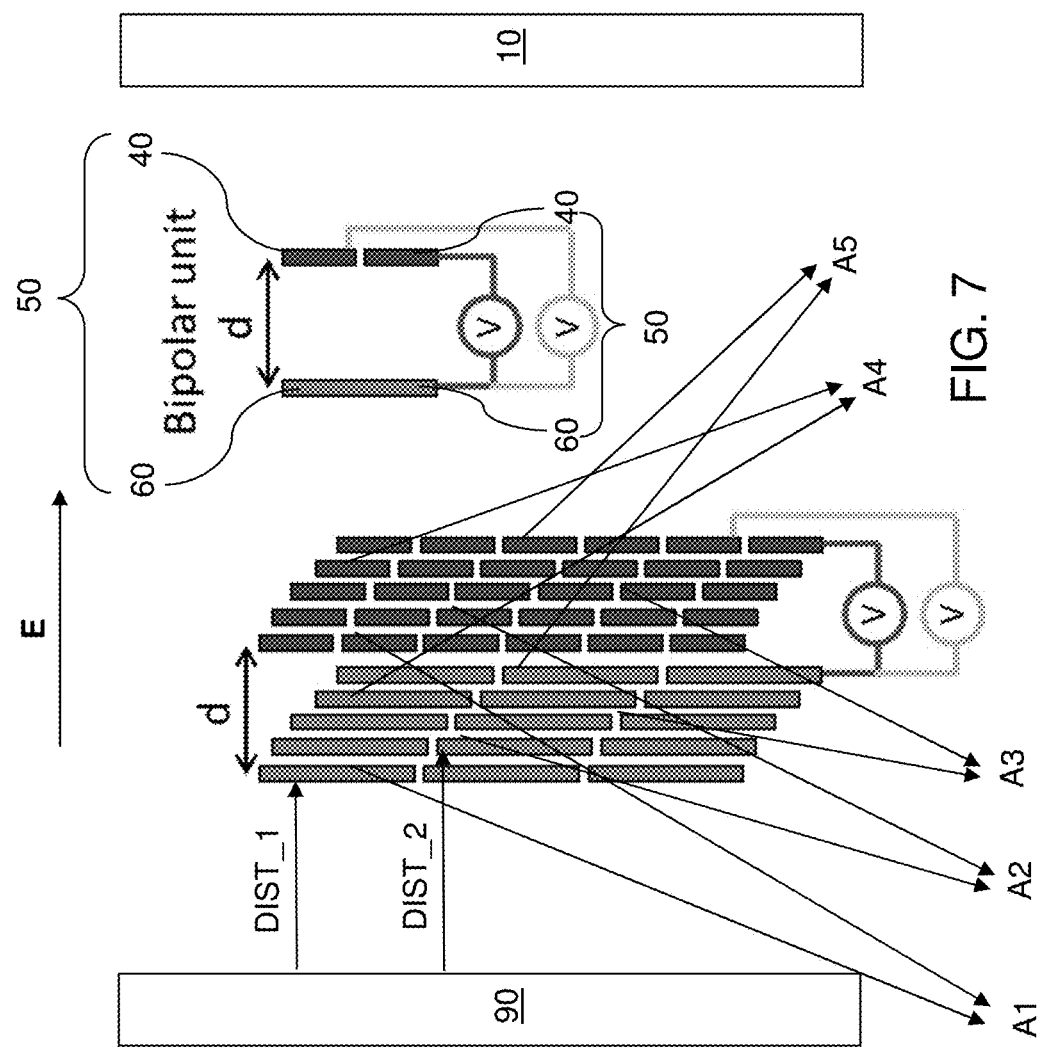
FIG. 7 is a schematic top-down view of a fourth configuration of the exemplary bubble detection apparatus of the present disclosure.

Referring to FIG. 7, a fourth configuration of the exemplary bubble detection apparatus of the present disclosure can be derived from any of the first, second, and third configurations of the exemplary bubble detection apparatus. In the fourth configuration, two or more neighboring first detection electrodes 60 located within a same array (A1, A2, A3, A4, A5) can be merged to provide a respective larger first detection electrode 60. Wiring on the first detection electrodes 60 can be simplified, and a more compact design can be provided. A bubble 7 can be detected when the bubble 7 envelops a second detection electrode 40.

In one embodiment, an electrode spacing within a first subset (such as a first array A1) of the multiple bipolar detection units 50 is greater than a distance between the first plane and the second plane (i.e., the difference between the first distance DIST_1 and the second distance DIST_2), and second detection electrodes 40 within the first subset of the multiple bipolar detection units 50 are more distal from the one of the pair of driving electrodes (which may be the driving anode 90 or the driving cathode 10) than first detection electrodes 60 within a second subset (such as a second array A2) of the multiple bipolar detection units 50 are from the one of the pair of driving electrodes.

In one embodiment, a maximum lateral dimension (such as a width along a direction that is perpendicular to the direction of the electric field E) of each of the first detection electrodes 60 of a subset (such as any of the arrays (A1, A2, A3, A4, A5)) of the multiple bipolar detection units 50 within a plane (such as the first plane located at the first distance DIST_1) that is perpendicular to the direction of the electric field E is greater than a maximum lateral dimension (such as a width) of each of the second detection electrodes 40 of the subset of the multiple bipolar detection units within another plane that is perpendicular to the direction of the electric field E (and containing surfaces of the second detection electrodes 40). In other words, the first detection electrode 60 may be wider than the second detection electrodes 40 within one, and/or more, and/or each, of the arrays (A1, A2, A3, A4, A5) of the multiple bipolar detection units 50.

In one embodiment, each of the first detection electrodes 60 in the multiple bipolar detection units 50 can be connected to a respective set of multiple second detection electrodes 40 through a respective plurality of voltmeters. Each of the second detection electrodes 40 within the multiple bipolar detection units 50 can be connected to only a respective single one of the first detection electrodes 60 in the multiple bipolar detection units 50. For example, N bipolar detection units 50 may include a single first detection electrode 60 and N second detection electrodes 40, in which N is an integer greater than 1.

Referring to FIGS. 8A and 8B, a fifth configuration of the exemplary bubble detection apparatus of the present disclosure can be derived from any of the first, second, third, and fourth configurations of the exemplary bubble detection apparatus. In the fifth configuration, two or more neighboring second detection electrodes 40 located within a same array (A1, A2, A3, A4, A5) can be merged to provide a respective larger second detection electrode 40. Wiring on the second detection electrodes 40 can be simplified, and a more compact design can be provided. A bubble 7 can be detected when the bubble 7 envelops a first detection electrode 60.

In one embodiment, the first detection electrodes 60 of a subset (such as an array (A1, A2, A3, A4, or A5)) of the multiple bipolar detection units 50 are arranged as an array of discrete first detection electrodes 60 arranged within a plane that is perpendicular to the direction of the electric field E, and a set of at least two second detection electrodes 40 of the subset of the multiple bipolar detection units 50 is embodied as a common second detection electrode 40. In one embodiment, N bipolar detection units 50 may comprise N first detection electrodes 60 and a common second detection electrode 40. The common second detection electrode 40 may have a width that is greater than N times the width of a first detection electrode 60 within the N bipolar detection units 50.

FIG. 9 is a schematic top-down view of a sixth configuration of the exemplary bubble detection apparatus of the present disclosure. In this embodiment, each of the first detection electrodes 60 in the multiple bipolar detection units 50 can be connected to a respective set of multiple second detection electrodes 40 through a respective plurality of voltmeters. Each of the second detection electrodes 40 within the multiple bipolar detection units 50 can be connected to only a respective single one of the first detection electrodes 60 in the multiple bipolar detection units 50. For example, N bipolar detection units 50 may include a single first detection electrode 60 and N second detection electrodes 40, in which N is an integer greater than 1. In one embodiment, each of the N second detection electrode 40 and the first detection electrode 60 in a bipolar detection unit 50 may have a same lateral dimension (such as a width) along a direction that is perpendicular to the direction of the electric field E.

In one embodiment, the respective set of multiple second detection electrodes 40 comprises a respective plurality of second detection electrodes 40 that are laterally spaced by different distances from one of the pair of driving electrodes (90, 10) along the direction of electric field E. In one embodiment, the respective set of multiple second detection electrodes 40 comprises a respective plurality of second detection electrodes 40 having the same lateral dimension (such as a width) along a lateral direction that is perpendicular to the direction of the electric field E. In the sixth configuration of the exemplary bubble detection apparatus, the potential difference between a first detection electrode 60 and a second detection electrode 40 of a bipolar detection unit 50 varies depending on the electrode spacing between the first detection electrode 60 and the second detection electrode 40.

Referring to FIG. 10, a seventh configuration of the exemplary bubble detection apparatus of the present disclosure can be derived from the sixth configuration of the exemplary bubble detection apparatus. In one embodiment, the respective set of multiple second detection electrodes 40 connected to a common first detection electrode 60 comprises a respective plurality of second detection electrodes 40 having different lateral dimensions (such as widths) along a lateral direction that is perpendicular to the direction of the electric field E. In one embodiment, multiple types of second detection electrodes 40 having different widths can be connected to a common first detection electrode 60. In one embodiment, the multiple types of second detection electrodes 40 can have different electrode spacings from the first detection electrode 60. For example, first-type second detection electrode 40 may have a first width and a first electrode spacing from the first detection electrode 60, second-type second detection electrode 40 may have a second width and a second electrode spacing from the first detection electrode 60, etc.

Figure 11:
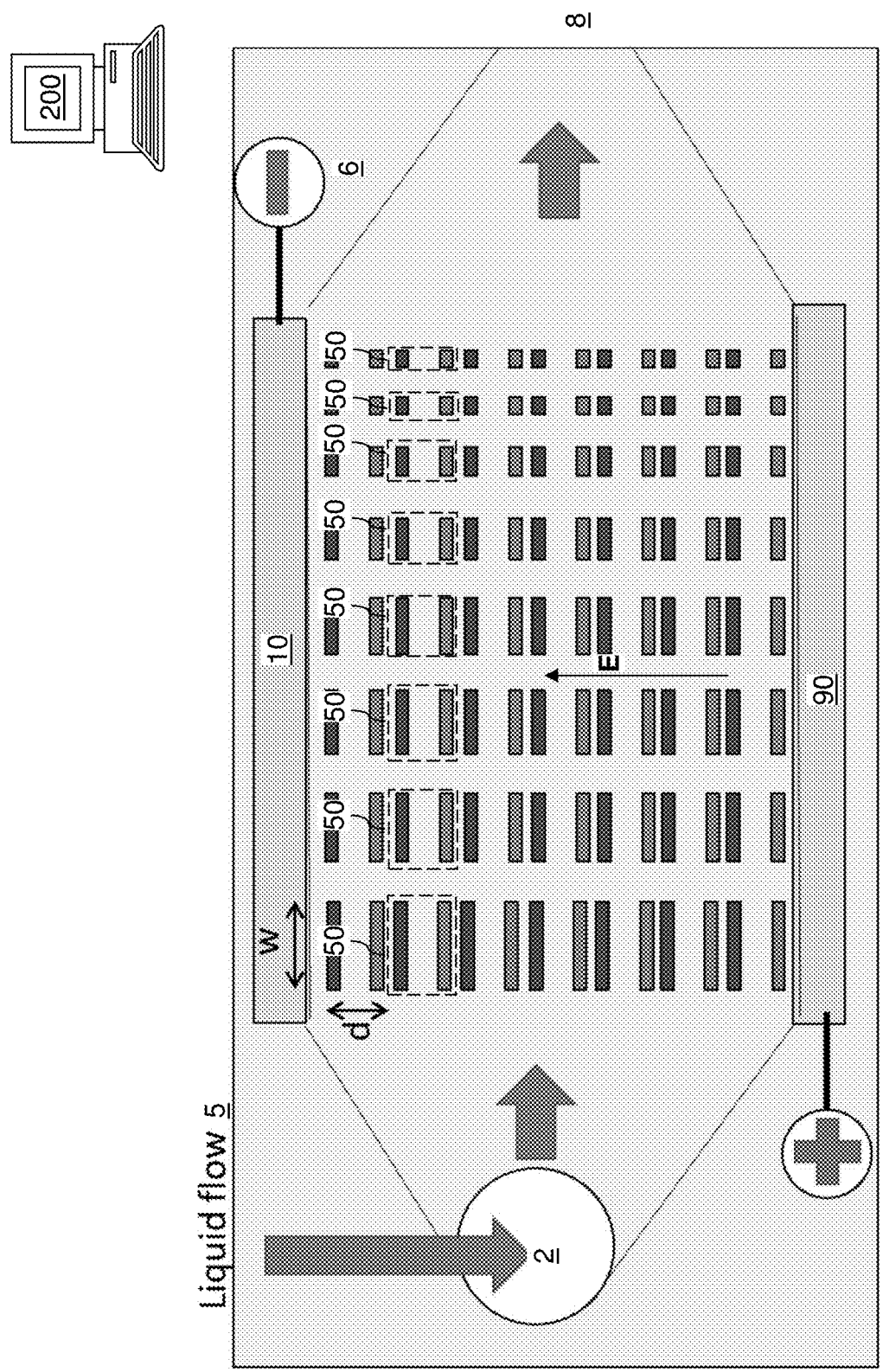
FIG. 11 is a schematic top-down view of an eighth configuration of the exemplary bubble detection apparatus of the present disclosure.

Referring to FIG. 11, an eighth configuration of the exemplary bubble detection apparatus of the present disclosure can be derived from any of the previously described configurations of the exemplary bubble detection apparatus of the present disclosure by positioning the driving electrodes (90, 10) along a direction that is not parallel to the flow direction of the fluid 5. For example, the separation direction between the driving anode 90 and the driving cathode 10 can be perpendicular to the direction of the flow of the fluid 5, and/or the lateral separation direction between an inlet 2 and an outlet 8. Bubbles 7 can be detected when a bubble envelops any of the first detection electrodes 60 or the second detection electrodes 40. In this configuration, the bubble detection apparatus may comprise an inlet 2 configured to receive a flow of the fluid 5 into the container 6, and an outlet 8 configured to dispense the fluid 5 from the container 6 therethrough. The inlet 2 and the outlet 8 are spaced apart along a direction that is perpendicular to a separation direction between the pair of driving electrodes (90, 10). In one embodiment, the bipolar detection units 50 may be arranged as a two-dimensional rectangular array of bipolar detection units 50 having a uniform or non-uniform pitch along the separation direction between the driving anode 90 and the driving cathode 10, and having a uniform or non-uniform pitch along the separation direction between the inlet 2 and the outlet 8.

Figure 12:
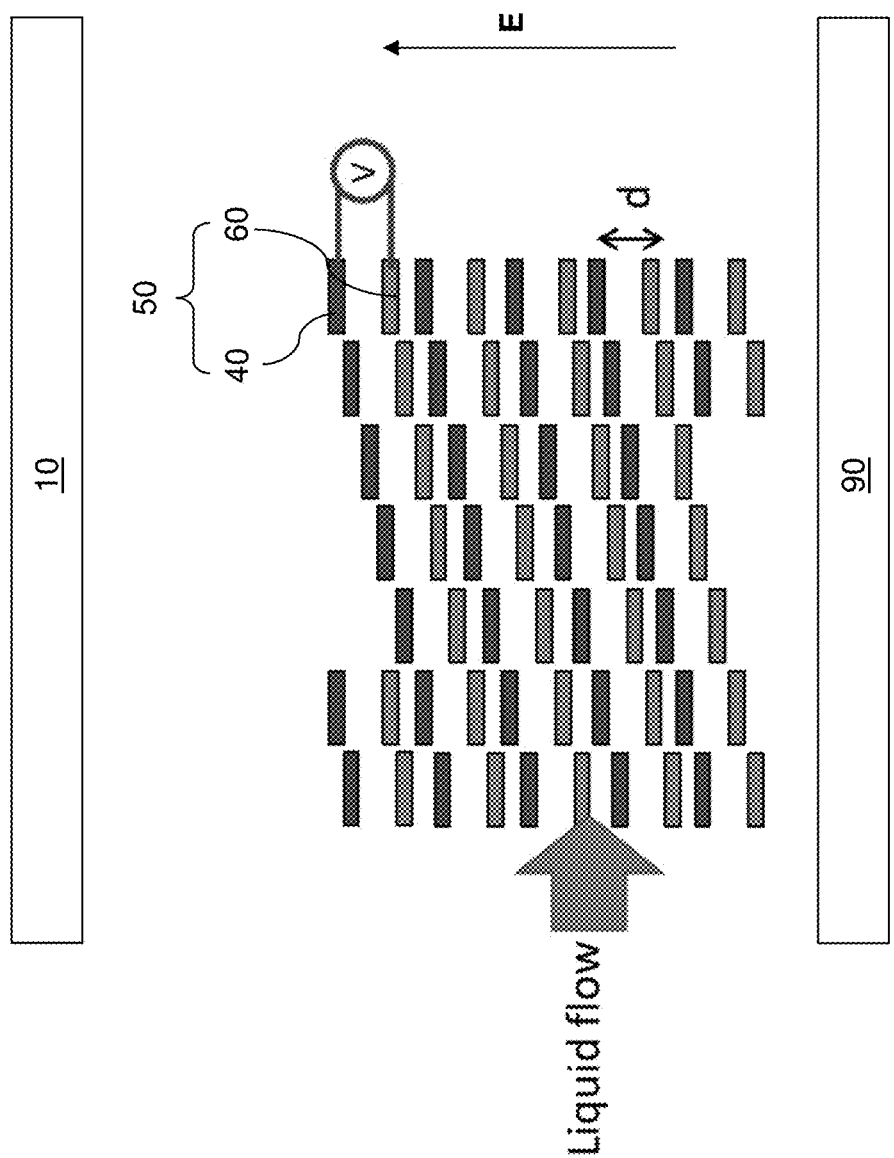
FIG. 12 is a schematic top-down view of a ninth configuration of the exemplary bubble detection apparatus of the present disclosure.

Referring to FIG. 12, a ninth configuration of the exemplary bubble detection apparatus of the present disclosure can be derived from the eighth configuration of the bubble detection apparatus of the present disclosure by positioning the bipolar detection units 50 in a non-rectangular array. In some embodiments, columns of bipolar detection units 50 arranged along the separation direction between the driving electrodes (90, 10) may be laterally offset along the separation direction between the driving electrodes (90, 10) from column to column. In some embodiments, rows of bipolar detection units 50 arranged along the flow direction may be laterally offset along the flow direction from row to row.

Figure 13A:
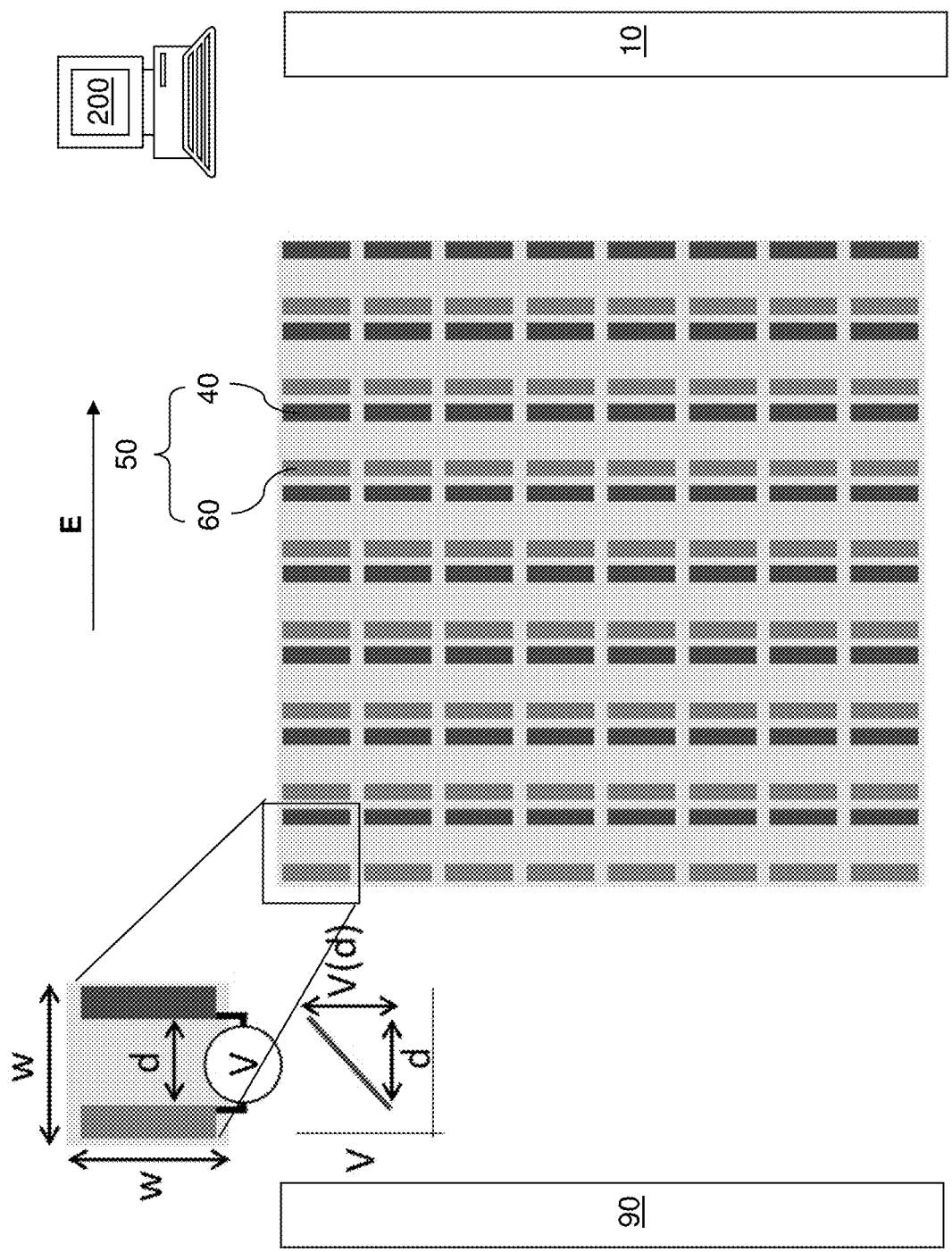
FIG. 13A is a schematic top-down view of a tenth configuration of the exemplary bubble detection apparatus of the present disclosure.

Referring to FIG. 13A, a tenth configuration of the exemplary bubble detection apparatus of the present disclosure can be derived from any of the previously described configurations of the exemplary bubble detection apparatus by arranging a plurality of bipolar detection units 50 as a periodic array, such as a rectangular periodic array, having a first periodicity along a first direction and having a second periodicity along a second direction. In one embodiment, the first direction may be parallel to the direction of the electric field E, and the second direction may be perpendicular to the direction of the electric field E. In another embodiment, the first direction and the second direction may be orthogonal directions that are perpendicular to the direction of the electric field E.

Referring to FIGS. 13B and 13C and according to an aspect of the present disclosure, the periodic array of bipolar detection units 50 may be connected to the computing unit 200. The potential difference between a first detection electrode 60 and a second detection electrode 40 within each bipolar detection unit 50 can be continuously monitored. The outputs from the array of voltmeters 55 of the array of bipolar detection units 50 are mapped into an output array that replicates the physical locations of the bipolar detection units 50 in a virtual coordinate system. When no bubble 7 passes through the array of bipolar detection units 50, all outputs of the array of the voltmeters can be non-zero, which are translated into an array of "1's" within the digitized output map, as illustrated in FIG. 13B. When a bubble 7 passes through the array of bipolar detection units 50, a subset of the outputs from the array of the voltmeters 55 can be zero volts, which is translated into logical "0's" within the digitized output map illustrated in FIG. 13C. The areas the "0's" within the digitized output map can be employed to estimate the size of the detected bubble 7. The frequency detection of bubbles 7 measures the bubble density within the fluid 5. The exemplary bubble detection apparatus of the present disclosure can simultaneously measure the size distribution and the density of bubbles 7 within the fluid 5.

Figure 14:
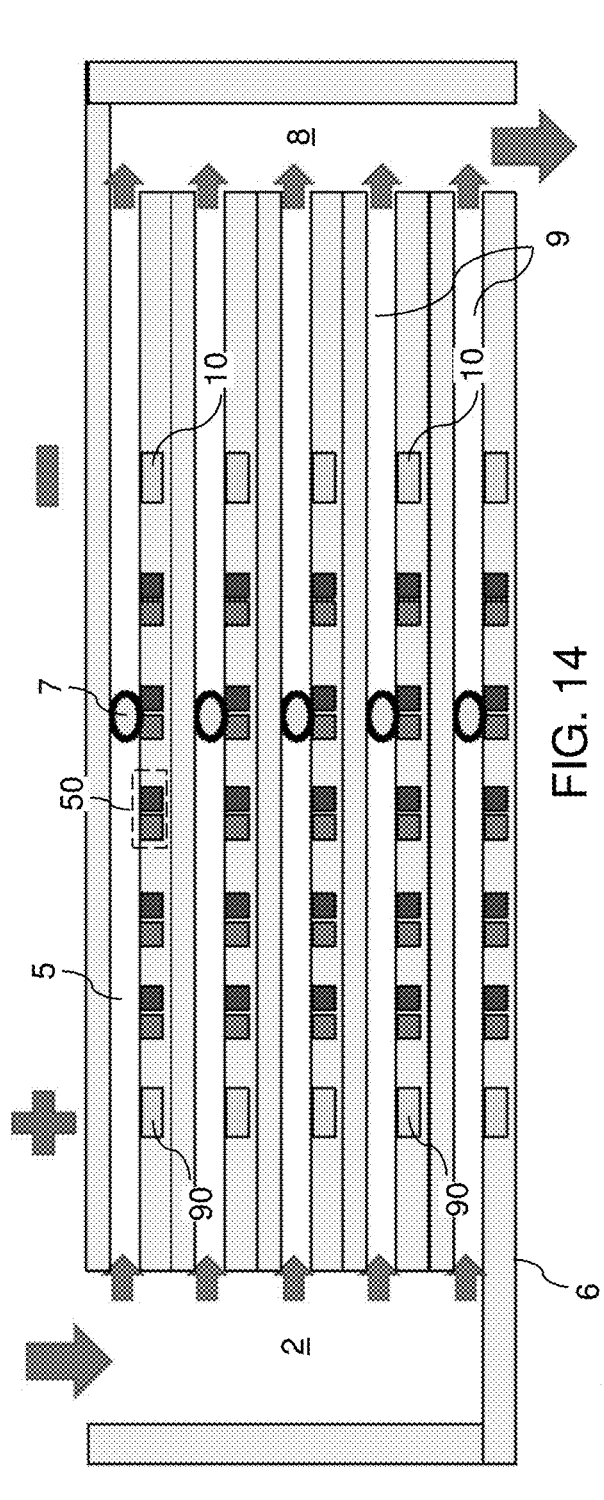
FIG. 14 is a schematic top-down view of an eleventh configuration of the exemplary bubble detection apparatus of the present disclosure.

Referring to FIG. 14, an eleventh configuration of the exemplary bubble detection apparatus of the present disclosure can be derived from any of the previously described configurations of the exemplary structure by employing a row of driving anodes 90 in lieu of a driving anode 90, and/or by employing a column of driving cathodes 10 in lieu of a driving cathode 10. Optionally, a plurality of flow channels 9 may be provided in lieu of a single flow channel 9 to facilitate flow of the fluid 5 therethrough. In one embodiment, a one-dimensional array or a two-dimensional array of bipolar detection units 50 may be provided on a sidewall of each flow channel 9.

Figure 15:
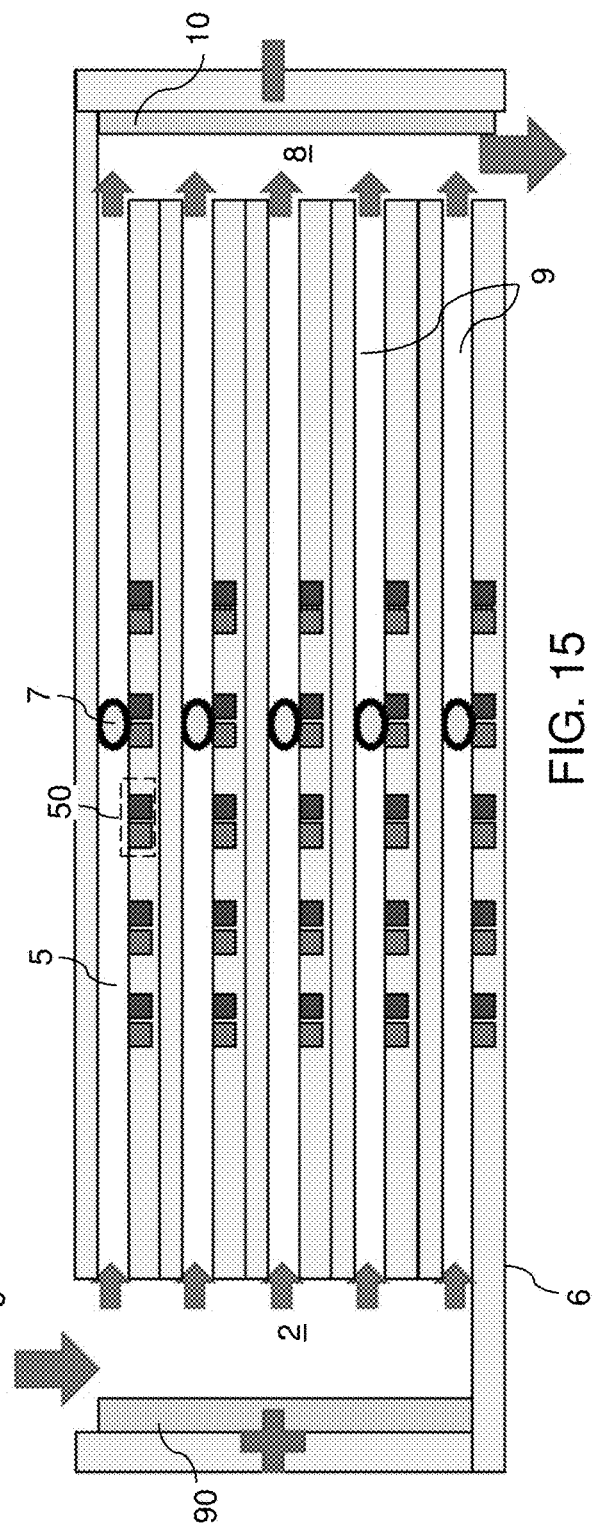
FIG. 15 is a schematic top-down view of a twelfth configuration of the exemplary bubble detection apparatus of the present disclosure.

Referring to FIG. 15, a twelfth configuration of the exemplary bubble detection apparatus of the present disclosure may be derived from the eleventh configuration of the exemplary bubble detection apparatus by positioning at least one driving anode 90 on a sidewall of the container 6 (e.g., on a sidewall of the inlet 2) in a manner that does not impede the flow of the fluid 5, and/or by positioning at least one driving cathode 10 on a sidewall of the container 6 (e.g., On a sidewall of the outlet 9) in a manner that does not impede the flow of the fluid 5.

Figure 16A:
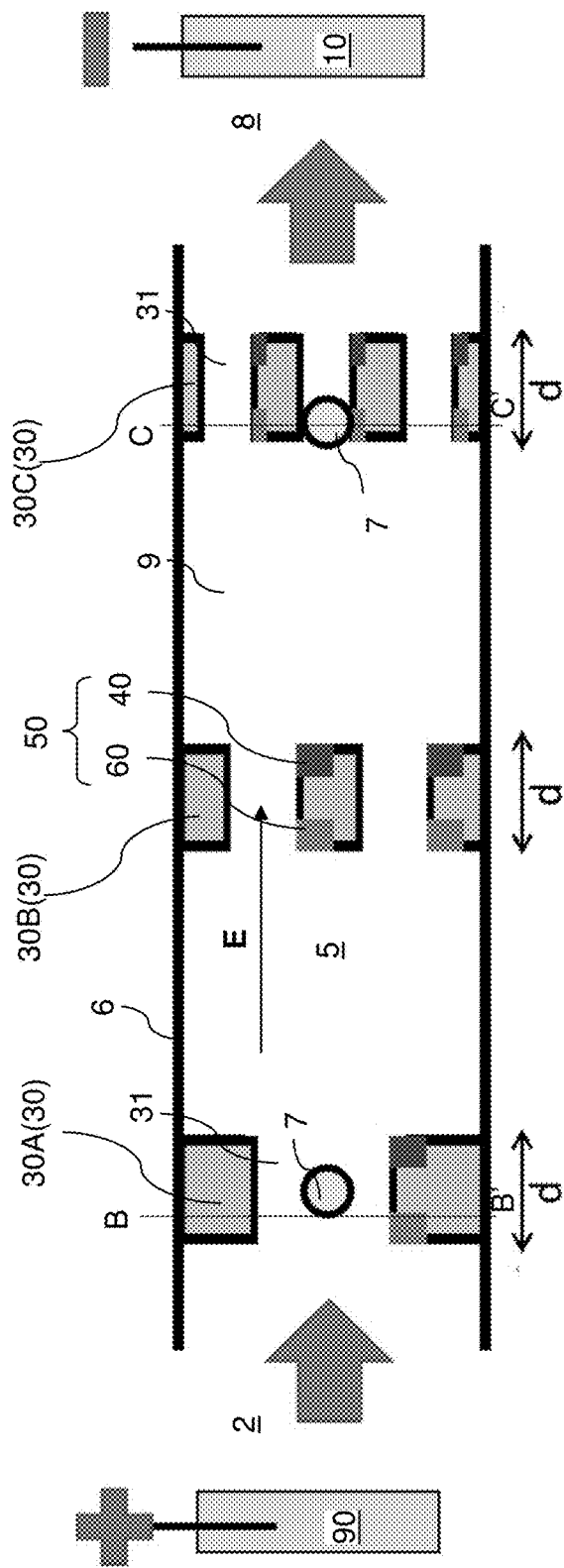
FIG. 16A is a schematic vertical cross-sectional view of a thirteenth configuration of the exemplary bubble detection apparatus of the present disclosure.
Figure 16C:
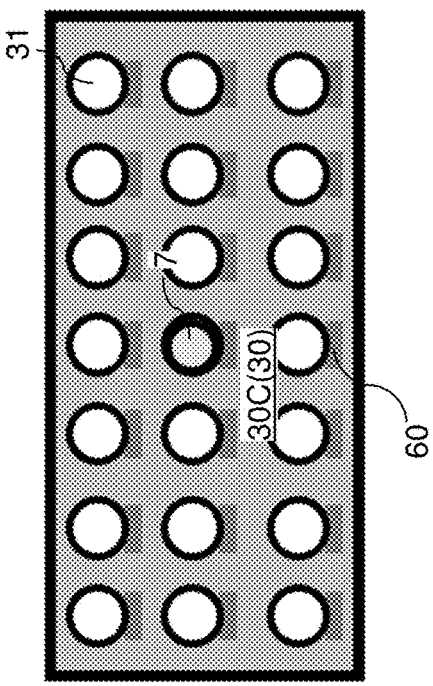
FIGS. 16B and 16C are schematic vertical cross-sectional views along planes B-B' and C-C' in FIG. 16A of the thirteenth configuration of the exemplary bubble detection apparatus of the present disclosure.
Figure 16B:
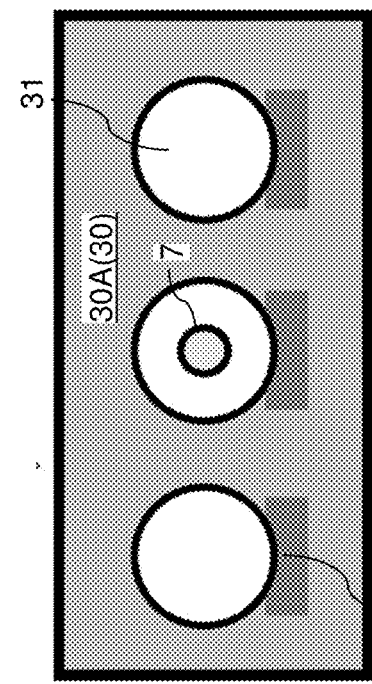

Referring to FIGS. 16A-16C, a thirteenth configuration of the exemplary bubble detection apparatus of the present disclosure may be derived from any of the previously described configurations of the exemplary bubble detection apparatus by providing at least one perforated flow blocking structure 30 including an array of openings 31 configured to guide flow of the fluid 5 therethrough. Each of the at least one perforated flow blocking structure 30 may comprise a respective perforated plate blocking the flow of the fluid 5 within the container 6 of the bubble detection apparatus, and including a one-dimensional array of openings 31 therethrough or a two-dimensional array of openings 31 therethrough.

In one embodiment, multiple bipolar detection units 50 can be formed on, or around, the openings in the perforated flow blocking structure(s) 30. In one embodiment, the multiple bipolar detection units 50 may comprise a respective pair of a first detection electrode 60 and a second detection electrode 40 and a voltmeter 55 connecting the pair of the first detection electrode 60 and the second detection electrode 40. In one embodiment, the first detection electrode 60 and the second detection electrodes 40 may be located on surfaces of the openings (such as tubular surfaces) through the perforated flow blocking structure(s) 30. Specifically, the first and second detection electrodes (60, 40) may be coated on the respective front and back sides of the perforated flow blocking structure 30 around the openings 31 if the perforated flow blocking structure 30 is electrically insulating (e.g., made of a glass, plastic or ceramic material).

In one embodiment, the multiple bipolar detection units 50 may comprise a one-dimensional array of the multiple bipolar detection units 50 located within a one-dimensional array of openings 31 within a perforated flow blocking structure 30, such as a first perforated flow blocking structure 30A. Further, the multiple bipolar detection units 50 may comprise two-dimensional arrays of the multiple bipolar detection units 50 located within a respective two-dimensional array of openings 31 within a respective perforated flow blocking structure 30, such as a second perforated flow blocking structure 30B or a third perforated flow blocking structure 30C.

In one embodiment, a subset of the multiple bipolar detection units 50 comprises a two-dimensional array of bipolar detection units located on a two-dimensional array of openings 31 within a perforated flow blocking structure (30B, 30C) that are configured to guide flow of the fluid 5 therethrough, and the first detection electrodes 60 and the second detection electrodes 40 of the two-dimensional periodic array of bipolar detection units 50 can be physically exposed to a respective opening 31 in the two-dimensional array of openings.

In one embodiment, the multiple bipolar detection units 50 may comprise an array of bipolar detection units 50 having a first pitch along a first direction and a second pitch along a second direction. For example, the second perforated flow blocking structure 30B may comprise a two-dimensional array of openings 31 therethrough, and the two-dimensional array of openings 31 in the second perforated flow blocking structure 30B may have the first pitch along the first direction and the second pitch along the second direction. The first direction and the second direction may be perpendicular to the direction of the flow of the fluid 5. In one embodiment, the first direction may be perpendicular to the direction of the electric field E, and the second direction may be perpendicular to the direction of electric field E and perpendicular to the first direction.

In one embodiment, an additional perforated flow blocking structure, such as the third perforated flow blocking structure 30C, can be provided. The third perforated flow blocking structure 30C may be spaced from the second perforated flow blocking structure 30B, and may have a respective two-dimensional array of openings 31 therethrough. Additional bipolar detection units 50 comprising an additional array of bipolar detection units 50 can be located on the two-dimensional array of openings in the third perforated flow blocking structure 30C. The additional array of bipolar detection units 50 and the two-dimensional array of openings in the third perforated flow blocking structure 30C may have a third pitch along the first direction and a fourth pitch along the second direction. The third pitch is less than the first pitch and the fourth pitch is less than the second pitch. In this case, the size (e.g., diameter) of the openings 31 through the third perforated flow blocking structure 30C can be smaller than the size of the openings 31 through the second perforated flow blocking structure 30B.

In one embodiment, the first detection electrode 60 and the second detection electrode 40 of each bipolar detection unit 50 can be located on a same side of a surface of an opening 31 in a respective perforated flow blocking structure 30. For example, the first detection electrode 60 and the second detection electrode 40 of a bipolar detection unit 50 may be located on a bottom surface of an opening 31 (but on opposite sides of the structure 30) in a perforated flow blocking structure 30, on a top surface of an opening in a perforated flow blocking structure 30, or on a sidewall of an opening in a perforated flow blocking structure 30.

Referring to FIGS. 17 and 18, fourteenth and fifteenth configurations of the exemplary bubble detection apparatus of the present disclosure can be derived from the thirteenth configuration of the bubble detection apparatus be employing a combination of a front perforated flow blocking structure 32 and a backside perforated flow blocking structure 34 in lieu of a perforated flow blocking structure 30. For example, a first perforated flow blocking structure 30A in the thirteenth configuration of the exemplary bubble detection apparatus may be replaced with a combination of a first front perforated flow blocking structure 32A and a first backside perforated flow blocking structure 34A, and a second perforated flow blocking structure 30B in the thirteenth configuration of the exemplary bubble detection apparatus may be replaced with a combination of a second front perforated flow blocking structure 32B and a second backside perforated flow blocking structure 34B, and so forth. For each pair of a front perforated flow blocking structure 32 and a backside perforated flow blocking structure 34, an array of first detection electrodes 60 for multiple bipolar detection units 50 can be provided on openings through the front perforated flow blocking structure 32, and an array of second detection electrodes 40 for the multiple bipolar detection units 50 can be provided on openings through the backside perforated flow blocking structure 34.

The number of the openings 31 in the front perforated flow blocking structure 32 may, or may not be, the same as the number of openings through the backside perforated flow blocking structure 34 within a pair of the front perforated flow blocking structure 32 and the backside perforated flow blocking structure 34. The number of the first detection electrodes 60 on the front perforated flow blocking structure 34 may be the same as (as shown in FIG. 17), or may be different from (as shown in FIG. 18) the number of second detection electrodes 40 on the backside perforated flow blocking structure 34 within a pair of the front perforated flow blocking structure 32 and the backside perforated flow blocking structure 34. In these configurations, the distance between a first detection electrode 60 and a second detection electrode 40 within each bipolar detection unit 50 can be determined primarily by the separation distance between the front perforated flow blocking structure 32 and the backside perforated flow blocking structure 34. Generally, a bubble 7 can be detected when the bubble covers the entirety of a physically exposed surface of a first detection electrode 60 or a second detection electrode 40.

Referring to FIGS. 19A-19C, a sixteenth configuration of the exemplary bubble detection apparatus of the present disclosure can be derived from the thirteenth configuration of the exemplary bubble detection apparatus by positioning a first detection electrode 60 and a second detection electrode 40 of at least one bipolar detection unit 50 within different openings of a perforated flow blocking structure 30, or on different surfaces (such as a top surface and a bottom surface) of a same opening 31 but on opposite sides of the perforated flow blocking structure 30. Multiple perforated flow blocking structures 30 having openings of different sizes and/or of different periodicity may be employed. A bubble 7 can be detected when the bubble covers the entirety of a physically exposed surface of a first detection electrode 60 or a second detection electrode 40.

Figure 20A:
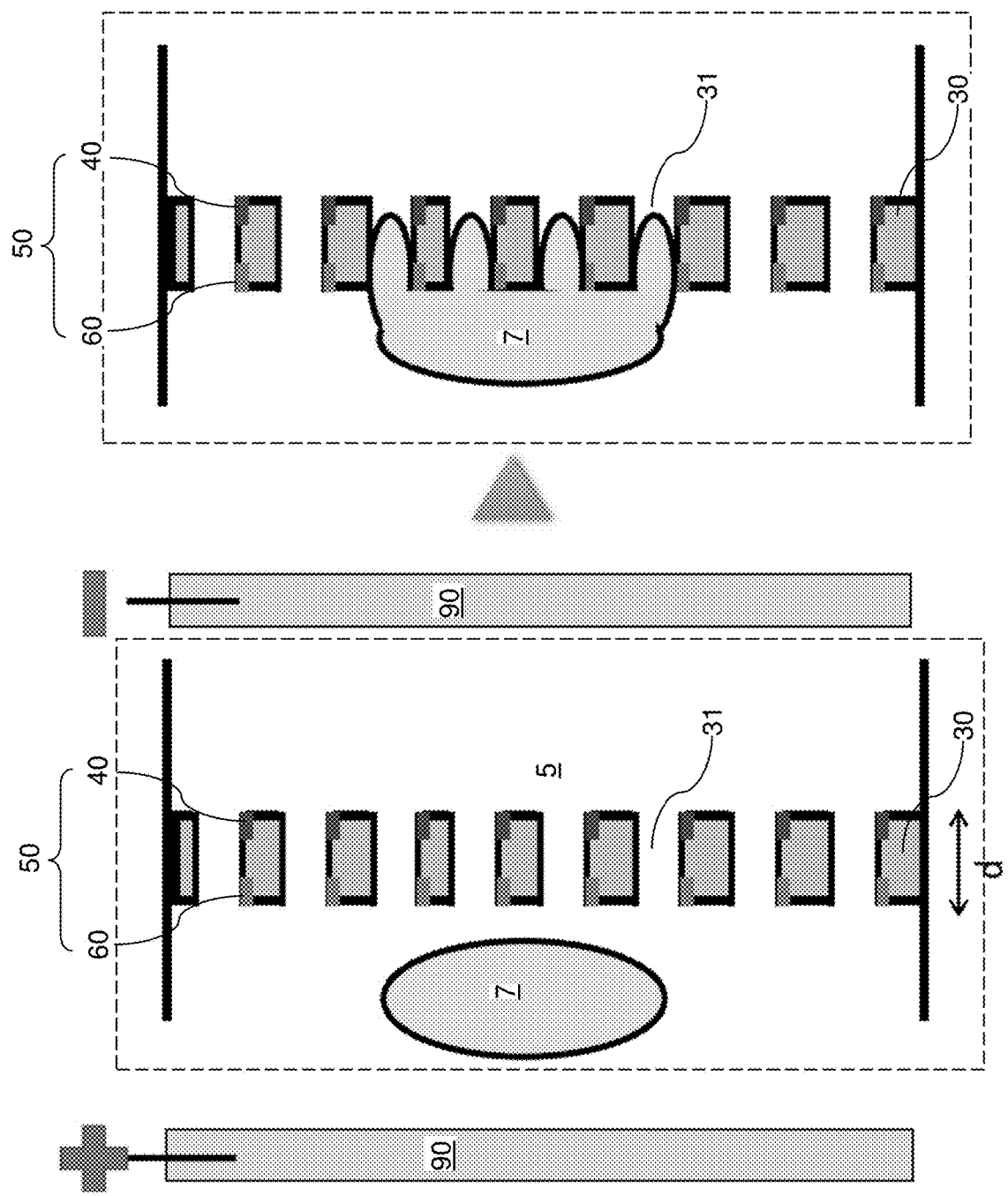
FIG. 20A illustrates an array of bipolar detection units prior to, and during, detection of a bubble according to an embodiment of the present disclosure.

FIG. 20A illustrates an array of bipolar detection units 50 prior to, and during, detection of a bubble 7 according to an embodiment of the present disclosure. Generally, each of the previously described configurations of the bubble detection apparatus, such as the configurations containing the perforated flow blocking structure 30 of the present disclosure may include a plurality of bipolar detection units 50 arranged as a periodic array, such as a rectangular periodic array. For example, a rectangular periodic array of bipolar detection units 50 may have a first periodicity along a first direction and a second periodicity along a second direction. In one embodiment, the first direction and the second direction may be orthogonal to each other, and may be perpendicular to the direction of the electric field E or may be perpendicular to the direction of flow of the fluid. A bubble 7 having a size that is greater than the first periodicity (i.e., a first pitch) and/or the second periodicity (i.e., a second pitch) can cover the entire area of at least one first detection electrode 60 and/or at least one second detection electrode 40 while passing through the periodic array of bipolar detection units 50 (e.g., while passing through plural openings 31 of the perforated flow blocking structure 30). For example, as shown on the right side of FIG. 20A, one large bubble 7 may pass through several openings 31 of the perforated flow blocking structure 30 at the same time.

Figure 20B:
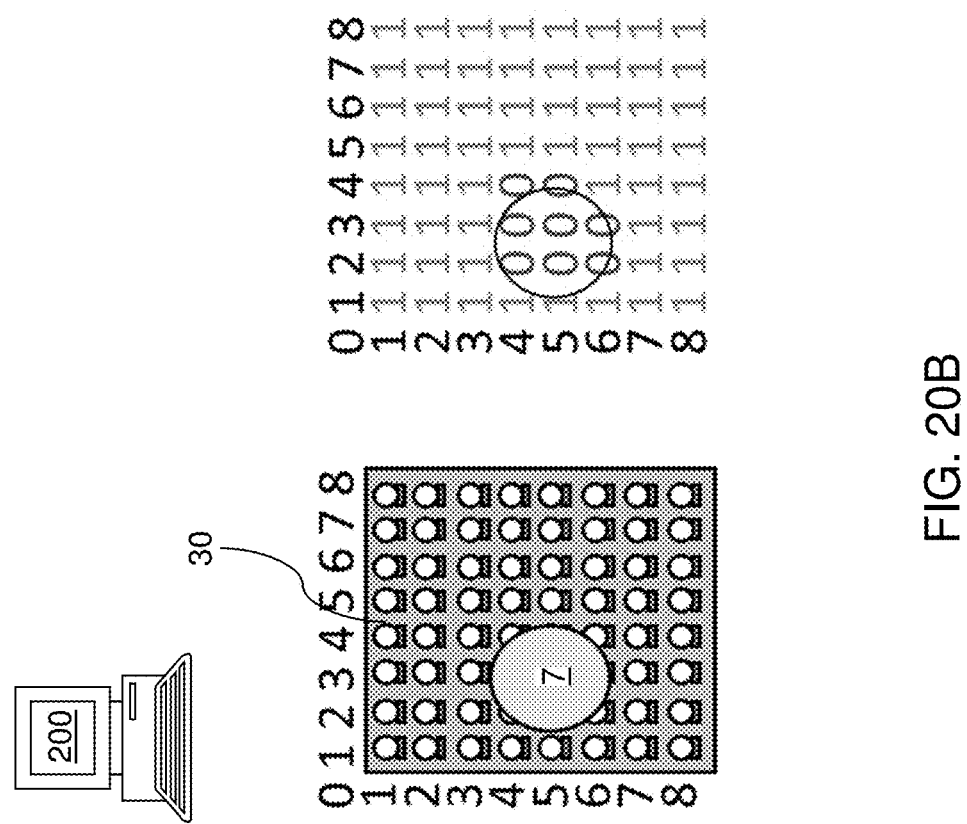
FIG. 20B illustrates the array of bipolar detection units of FIG. 20A and a data map from the array of bipolar detection units during detection of a bubble according to an embodiment of the present disclosure.

Referring to FIG. 20B and according to an aspect of the present disclosure, the periodic array of bipolar detection units 50 may be wired or wirelessly connected to the computing unit 200. The potential difference between a first detection electrode 60 and a second detection electrode 40 within each bipolar detection unit 50 can be continuously monitored. The outputs from the array of voltmeters 55 of the array of bipolar detection units 50 are mapped into an output array that replicates the physical locations of the bipolar detection units 50 in a virtual coordinate system. When no bubble 7 passes through the array of bipolar detection units 50, all outputs of the array of the voltmeters can be non-zero, which are translated into an array of "1's" within a digitized output map. When a bubble 7 passes through the array of bipolar detection units 50, a subset of the outputs from the array of the voltmeters can be zero volt, which is translated into logical "0's" within the digitized output map illustrated in FIG. 20B. The areas the "0's" within the digitized output map can be employed to estimate the size of the detected bubble 7. In other words, the "0's" represent the output of the bipolar detection units 50 adjacent to openings 31 of the perforated flow blocking structure 30 through which the bubble 7 is passing, while the "1's" represent the output of the bipolar detection units 50 adjacent to openings 31 of the perforated flow blocking structure 30 through which no bubble 7 is passing. The size of the bubble 7 may be determined by determining the number of adjacent bipolar detection units 50 that output a "0" signal. The frequency detection of bubbles 7 measures the bubble density within the fluid 5. The exemplary bubble detection apparatus of the present disclosure can simultaneously measure the size distribution and the density of bubbles 7 within the fluid 5.

Figure 21:
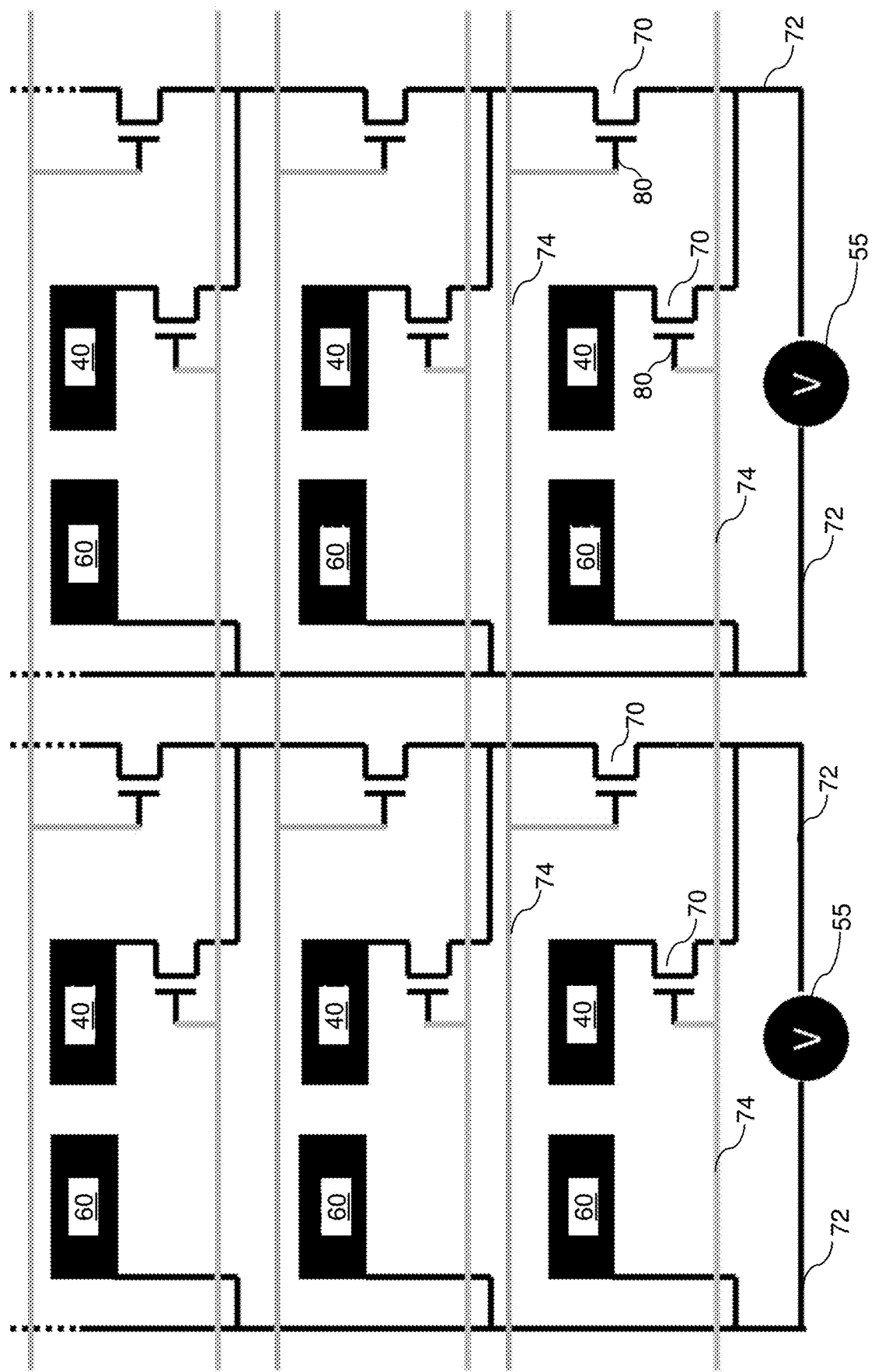
FIG. 21 is a schematic diagram for an array of detection electrode pairs and a circuit for sequentially switching selected bipolar detection units according to an embodiment of the present disclosure.

Referring to FIG. 21, a circuit for sequentially addressing selected pairs of a first detection electrode 60 and a second detection electrode 40 is illustrated according to an embodiment of the present disclosure. A common voltmeter 55 may be employed for multiple pairs of a first detection electrode 60 and a second detection electrode 40 located within a same row of pairs of a respective first detections electrode 60 and a respective second detection electrode 40, i.e., within a same row of detection electrode pairs (60, 40). Transistors 70 located the voltmeter 55 connector lines 72 may be used to select a specific electrode (60, 40). The transistors 70 may be controlled by a controller (or computing device 200) via gate lines 74 which are electrically connected to transistor gate electrodes 80 and which turn the transistors 70 on and off. Use of the circuit allows use of a single voltmeter 55 for each row of pairs of a first detection electrode 60 and a second detection electrode 40, and facilitates manufacture of a two-dimensional M×N array of detection electrode pairs (60, 40) sharing M voltmeters 55. Each row of detection electrode pairs (60, 40) may include N detection electrode pairs (60, 40), and M rows of detection electrode pairs (60, 40) may be provided within the two-dimensional M×N array. The number of N may be in a range from 2 to 1,024. The number M may be in a range from 2 to 1,024. N may be larger than M.

Figure 22A:
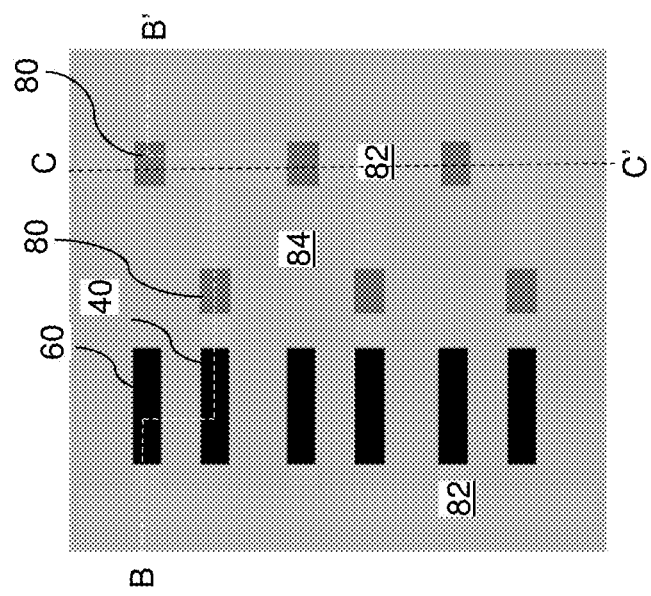
FIG. 22A is a top-down view of a region of the circuit of FIG. 21 according to an embodiment of the present disclosure.
Figure 22B:
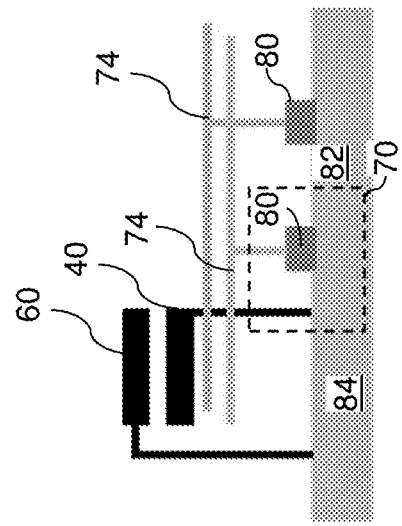
FIGS. 22B and 22C are schematic side cross-sectional views along planes B-B' and C-C' in FIG. 22A.
Figure 22C:
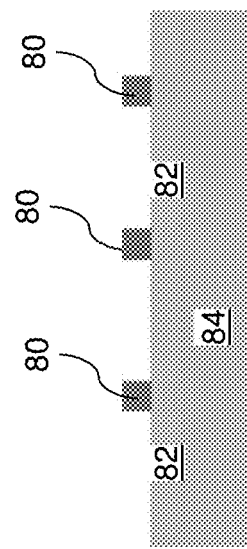

FIG. 22A is a top-down view of a region of a row of detection electrode pairs (60, 40) and a circuit of FIG. 21 according to an embodiment of the present disclosure. FIG. 22B is a side cross sectional view of the circuit of FIG. 22A along broken plane B-B' in FIG. 22A. FIG. 22C side cross sectional view of the circuit of FIG. 22A along plane C-C' in FIG. 22A. Field effect transistors 70 containing gate electrodes 80 and active regions 82 (e.g., doped semiconductor source and drain regions) located in a semiconductor (e.g., silicon) substrate 84 may be employed to provide electrical switching for the various detection electrodes (60, 40) within the two-dimensional M×N array of detection electrode pairs (60, 40) sharing M voltmeters 55.

Referring collectively to FIGS. 21 and 22A-22C, the bubble detection apparatus of the present disclosure may comprise a circuit configured to sequentially select a voltmeter 55 from the multiple voltmeters of the multiple bipolar detection units 50 by sequentially turning on a respective semiconductor switch (e.g., transistor 70) selected from an array of semiconductor switches 70, and to sequentially measure a voltage across the sequentially selected voltmeters 55. The computing unit 200 can be configured to estimate a size of the bubble 7 based on the locations at which measured voltages of the voltmeters 55 are below the respective reference level.

Referring to all drawings and according to various embodiments of the present disclosure, a bubble detection apparatus comprises a container 6 configured to flow a fluid 5 therein; a pair of driving electrodes (90, 10) located on opposite sides of the container 6 and configured to be exposed to the fluid 5; a bias circuit 4 configured to apply a driving potential across the pair of driving electrodes (90, 10) to generate an electric field; multiple bipolar detection units 50 located in the container 6 and configured to be immersed in the fluid 5, wherein each of the multiple bipolar detection units 50 comprises a respective first detection electrode 60 and a respective second detection electrode 40 that are spaced apart along a direction of electric field within the fluid 5 and comprises a current or voltage detection device configured to detect a current or voltage across the first detection electrode 60 and the second detection electrode 40; and a computing unit 200 configured to receive output currents or voltages from the current or voltage detection devices of one or more of the multiple bipolar detection units 50 and detect presence of a bubble 7 within the fluid 5 when one or more of the output voltages from the voltmeters of the multiple bipolar detection units 50 drop below a respective reference level.

Referring to all drawings and according to various embodiments of the present disclosure, a bubble detection method includes flowing a fluid 5 through a conduit 6 containing at least one bipolar electrode (40, 60), applying an electric field E across the fluid 5 in the conduit 6, and detecting a presence of a bubble 7 in the fluid 5 when the bubble flows around or through the bipolar electrode by detecting a current or voltage output from the at least one bipolar electrode.

In one embodiment, the at least one bipolar electrode comprises plural bipolar electrodes located in the conduit 6. The step of detecting the current or voltage output from the at least one bipolar electrode comprises detecting the voltage output from the plural bipolar electrodes (40, 60) using a voltmeter 55. In one embodiment, the method further comprises determining a size of the bubble 7 when the bubble flows around or through plural bipolar electrodes in the conduit 6.

In one embodiment, a first bipolar electrode (40, 60) of the plural bipolar electrodes has at least one different dimension from a second bipolar (40, 60) electrode of the plural bipolar electrodes. In another embodiment, each of the plural bipolar electrodes is located adjacent to one or more openings 31 in at least one perforated plate 30 located in the conduit 6.

In one embodiment, the step of detecting the presence of the bubble 7 in the fluid 5 comprises detecting when a current or voltage output from the at least one bipolar electrode drops below a reference level, and the fluid 5 comprises a photoresist fluid flowing from a photoresist reservoir through the conduit 6 to a nozzle located over a semiconductor device.

The various embodiments of the present disclosure can be employed to monitor the presence, density and the size distribution of bubbles 7 within the fluid 5 of a bubble detection apparatus, and to determine the suitability of the fluid 5 for its intended use based on the presence, density and/or size of the bubbles 7.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bubble detection apparatus, comprising:
a container configured to flow a fluid therein;
a pair of driving electrodes located on opposite sides of the container and configured to be exposed to the fluid;
a bias circuit configured to apply a driving potential across the pair of driving electrodes to generate an electric field;
multiple bipolar detection units located in the container and configured to be immersed in the fluid, wherein each of the multiple bipolar detection units comprises a respective first detection electrode and a respective second detection electrode that are spaced apart along a direction of the electric field within the fluid, and a current or voltage detection device configured to detect a current or voltage between the first detection electrode and the second detection electrode; and
a computing unit configured to receive output currents or voltages from the current or voltage detection devices of the multiple bipolar detection units and detect presence of a bubble within the fluid when one or more of the output currents or voltages from the current or voltage detection devices of one or more of the multiple bipolar detection units drop below a respective reference level.

2. The bubble detection apparatus of claim 1, wherein the current or voltage detection device comprises a voltmeter, and wherein the computing unit is configured to determine a size of the bubble based on location at which measured voltages from the voltmeters of the multiple bipolar detection units are below the respective reference level.

3. The bubble detection apparatus of claim 1, wherein the multiple types of bipolar detection units comprise:
   first-type bipolar detection units having a respective first-type first detection electrode and a respective first-type second detection electrode; and
   second-type bipolar detection units having a respective second-type first detection electrode and a respective second-type second detection electrode,
   wherein each of the second-type first detection electrodes differs from each of the first-type first detection electrodes by at least one dimension.

4. The bubble detection apparatus of claim 3, wherein:
   each of the first-type first detection electrodes has a first lateral dimension along a direction that is perpendicular to the direction of electric field;
   each of the second-type first detection electrodes has a second lateral dimension along the direction that is perpendicular to the direction of electrical filed; and
   the second lateral dimension is different from the first lateral dimension.

5. The bubble detection apparatus of claim 3, wherein a first electrode spacing between the respective first-type first detection electrode and the respective first-type second detection electrode is the same as a second electrode spacing between the respective second-type first detection electrode and the respective second-type second detection electrode.

6. The bubble detection apparatus of claim 3, wherein:
   the first-type bipolar detection units are arranged as a first array of first-type bipolar detection units located on a first plane that is perpendicular to the direction of electric field; and
   the second-type bipolar detection units are arranged as a second array of second-type bipolar detection units located on a second plane that is perpendicular to the direction of electric field and laterally spaced from the first plane.

7. The bubble detection apparatus of claim 1, wherein:
   the container comprises a tubular enclosure configured to confine the fluid along directions that are perpendicular to the direction of electric field; and
   an area laterally surrounded by inner sidewalls of the tubular enclosure within a plane that is perpendicular to the direction of electric field is invariant with a lateral distance from one of the pair of driving electrodes along the direction of electric field, or changes as a function of the lateral distance from the one of the pair of driving electrodes along the direction of electric field.

8. The bubble detection apparatus of claim 1, wherein the multiple bipolar detection units comprise:
   a first array of bipolar detection units including a first subset of the multiple bipolar detection units and arranged within a first plane that is perpendicular to the direction of electric field and is located at a first distance from one of the pair of driving electrodes; and
   a second array of bipolar detection units including a second subset of the multiple bipolar detection units and arranged within a second plane that is perpendicular to the direction of electric field and is located at a second distance from the one of the pair of driving electrodes, the second distance being different from the first distance.

9. The bubble detection apparatus of claim 1, wherein a maximum lateral dimension of each of the first detection electrodes of a subset of the multiple bipolar detection units within a plane that is perpendicular to the direction of electric field is greater than a maximum lateral dimension of each of the second detection electrodes of the subset of the multiple bipolar detection units within another plane that is perpendicular to the direction of the electric field.

10. The bubble detection apparatus of claim 2, wherein each of the first detection electrodes in the multiple bipolar detection units is connected to a respective set of multiple second detection electrodes through a respective plurality of voltmeters, and each of the second detection electrodes within the multiple bipolar detection units is connected to only a respective single one of the first detection electrodes in the multiple bipolar detection units.

11. The bubble detection apparatus of claim 1, wherein:
   the first detection electrodes of a subset of the multiple bipolar detection units are arranged as an array of discrete first detection electrodes arranged within a plane that is perpendicular to the direction of electric field; and
   a set of at least two second detection electrodes of the subset of the multiple bipolar detection units is embodied as a common second detection electrode.

12. The bubble detection apparatus of claim 1, further comprising:
   an inlet configured to receive a stream of the fluid into the container; and
   an outlet configured to dispense the fluid from the container therethrough,
   wherein the inlet and the outlet are spaced apart along a separation direction between the pair of driving electrodes or along a direction that is perpendicular to a separation direction between the pair of driving electrodes.

13. The bubble detection apparatus of claim 1, wherein:
   the multiple bipolar detection units comprises a two-dimensional periodic array of bipolar detection units having a first pitch along a first direction and a second pitch along a second direction;
   the first direction is perpendicular to the direction of electric field; and
   the second direction is perpendicular to the direction of electric field and is perpendicular to the first direction.

14. The bubble detection apparatus of claim 13, wherein:
   a subset of the multiple bipolar detection units comprises a two-dimensional array of bipolar detection units located on a two-dimensional array of openings within a perforated flow blocking structure that are configured to guide flow of the fluid therethrough; and
   the first detection electrodes and the second detection electrodes of the two-dimensional periodic array of bipolar detection units are physically exposed to a respective opening in the two-dimensional array of openings.

15. The bubble detection apparatus of claim 14, further comprising:
   an additional perforated flow blocking structure that is spaced from the perforated flow blocking structure; and
   additional bipolar detection units comprising an additional array of bipolar detection units having a third pitch along the first direction and a fourth pitch along the second direction, wherein the third pitch is less than the first pitch and the fourth pitch is less than the second pitch.

16. A bubble detection method, comprising:

flowing a fluid through a conduit containing at least one bipolar electrode;

applying an electric field across the fluid in the conduit; and detecting a presence of a bubble in the fluid when the bubble flows around or through the bipolar electrode by detecting a current or voltage output from the at least one bipolar electrode.

17. The method of claim 16, wherein:

the at least one bipolar electrode comprises plural bipolar electrodes located in the conduit;

the detecting the current or voltage output from the at least one bipolar electrode comprises detecting the voltage output from the plural bipolar electrodes; and the method further comprises determining a size of the bubble when the bubble flows around or through plural bipolar electrodes in the conduit.

18. The method of claim 17, wherein a first bipolar electrode of the plural bipolar electrodes has at least one different dimension from a second bipolar electrode of the plural bipolar electrodes.

19. The method of claim 17, wherein each of the plural bipolar electrodes is located adjacent to one or more openings in at least one perforated plate located in the conduit.

20. The method of claim 16, wherein:

detecting the presence of the bubble in the fluid comprises detecting when the current or voltage output from the at least one bipolar electrode drops below a reference level; and the fluid comprises a photoresist fluid flowing from a photoresist reservoir through the conduit to a nozzle located over a semiconductor device.

* * * * *